(12) United States Patent
Ishihara et al.

(10) Patent No.: US 9,496,298 B2
(45) Date of Patent: Nov. 15, 2016

(54) PHOTODIODE ARRAY MODULE AND METHOD FOR MANUFACTURING SAME

(75) Inventors: Masatoshi Ishihara, Hamamatsu (JP); Nao Inoue, Hamamatsu (JP); Hirokazu Yamamoto, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/005,872

(22) PCT Filed: Mar. 27, 2012

(86) PCT No.: PCT/JP2012/057993
§ 371 (c)(1),
(2), (4) Date: Sep. 18, 2013

(87) PCT Pub. No.: WO2012/133447
PCT Pub. Date: Oct. 4, 2012

(65) Prior Publication Data
US 2014/0008754 A1 Jan. 9, 2014

(30) Foreign Application Priority Data
Mar. 31, 2011 (JP) ................. 2011-079290

(51) Int. Cl.
*H01L 27/146* (2006.01)
*H04N 1/03* (2006.01)

(52) U.S. Cl.
CPC ... *H01L 27/14609* (2013.01); *H01L 27/14634* (2013.01); *H01L 27/14694* (2013.01);
(Continued)

(58) Field of Classification Search
CPC ........... H01L 27/146; H01L 27/14603; H01L 27/14607; H01L 27/14609; H01L 27/1463–27/13636; H01L 2224/16135; H01L 2224/16148; H01L 25/0657; H01L 25/162; H01L 25/043; H01L 25/13; H01L 25/117; H01L 21/563; H01L 31/0232; H01L 27/14643–27/14649
USPC ........................................... 438/462
See application file for complete search history.

(56) References Cited

U.S. PATENT DOCUMENTS 6,483,116 B1 * 11/2002 Kozlowski ........ H01L 27/14603
250/372
6,872,992 B2 3/2005 Muramatsu
(Continued)

FOREIGN PATENT DOCUMENTS

EP 1 179 851 2/2002
EP 1 763 075 3/2007
(Continued)

*Primary Examiner* — Tucker J Wright
*Assistant Examiner* — Stephen C Smith
(74) *Attorney, Agent, or Firm* — Drinker Biddle & Reath LLP

(57) ABSTRACT

A first semiconductor substrate 1 and a second semiconductor substrate 2 are different in material, and therefore have sensitivities to incident light of mutually different wavelength bands. Respective photodiodes of photodiode arrays are connected to amplifiers of the first semiconductor substrate 1. According to this method, the second semiconductor substrate 2 is separated from the wafer by etching the second semiconductor substrate 2 and then dicing a deepest portion of the etched groove. The density of crystal defects in a side surface produced by etching is smaller than the density of crystal defects in a side surface produced by dicing. Because a photodiode located in an end portion of the second semiconductor substrate 2 does not need to be removed, a reduction in the number of photodiodes can be suppressed.

8 Claims, 14 Drawing Sheets

(52) U.S. Cl.
CPC ............... *H04N1/03* (2013.01); *H01L 27/146* (2013.01); *H01L 2224/16135* (2013.01); *H01L 2224/16148* (2013.01)

(56) References Cited

U.S. PATENT DOCUMENTS

| | | | | |
|---|---|---|---|---|
| 7,052,975 | B2* | 5/2006 | Koizumi | H01L 21/78 |
| | | | | 257/E21.599 |
| 2002/0051068 | A1* | 5/2002 | Murayama | H01L 27/14623 |
| | | | | 348/294 |
| 2002/0060084 | A1* | 5/2002 | Hilton | H01L 21/563 |
| | | | | 174/523 |
| 2010/0044677 | A1 | 2/2010 | Nagai | |
| 2011/0233609 | A1* | 9/2011 | Cordat | H01L 27/1465 |
| | | | | 257/189 |

FOREIGN PATENT DOCUMENTS

| | | |
|---|---|---|
| JP | H2-022973 | 1/1990 |
| JP | 6-67114 A | 3/1994 |
| JP | 9-304182 A | 11/1997 |
| JP | 2001-345999 | 12/2001 |
| JP | 2004-119602 A | 4/2004 |
| JP | 2005-252411 | 9/2005 |
| JP | 2007-184355 A | 7/2007 |
| WO | WO-00/62344 A1 | 10/2000 |

* cited by examiner (A)

(B)

(C)

(A)

(B)

(C)

(D)

PHOTODIODE ARRAY MODULE AND METHOD FOR MANUFACTURING SAME

TECHNICAL FIELD

The present invention relates to a photodiode array module and a method of manufacturing the same.

BACKGROUND ART

Patent Document 1 discloses an image sensor in which a back incident-type CCD (a charge-coupled device) is disposed at a previous stage in an incident direction of light to be measured, and at a subsequent stage of the CCD, a photodiode array made of InGaAs is disposed. In the image sensor of this document, the CCD and photodiode array are connected via bumps, and signals from respective channels of the photodiode array are read out by a shift register formed on the CCD.

Patent Document 2 discloses one in which a CCD made of Si is disposed at an upper stage with respect to an incident light and an image sensor made of InGaAs is disposed at a lower stage.

Patent Document 3 discloses an image sensor for which two HgCdTe photodiode arrays are disposed side by side to be increased in dimension in the length direction. This is because it is difficult to fabricate a HgCdTd photodiode that is long in length on its own. When two photodiode arrays are placed side by side horizontally, the pixel pitch is likely to change at the position of a boundary between these photodiode arrays. In order to prevent this, two photodiode arrays have been overlapped in part. When photodiode arrays are disposed side by side, a photodiode (PD) present at a position closest to an end portion of each photodiode array becomes deteriorated in characteristics. In Patent Document 3, photodiodes located in the end portions are removed.

CITATION LIST

Patent Literature

Patent Document 1: Pamphlet of International Publication No. WO00/62344
Patent Document 2: Japanese Patent Application Laid-Open No. H09-304182
Patent Document 3: Japanese Patent Application Laid-Open No. H06-67114

SUMMARY OF INVENTION

Technical Problem

However, when photodiodes located in the end portions are removed, the number of photodiodes per module is reduced. The present invention has been made in view of such a problem, and an object thereof is to provide a photodiode array module in which a reduction in the number of photodiodes per module is suppressed and a method of manufacturing the same.

Solution to Problem

In order to solve the foregoing problem, a photodiode array module according to an aspect of the present invention is a photodiode array module including a first semiconductor substrate formed with a plurality of amplifiers, and made of a first semiconductor material, and a second semiconductor substrate adhered to the first semiconductor substrate, and made of a second semiconductor material different from the first semiconductor material, on which light is incident from the second semiconductor substrate side, and is characterized in that the first semiconductor substrate has a first photodiode array, the second semiconductor substrate has a second photodiode array at a side of a surface opposed to the first semiconductor substrate, a first group of a plurality of the amplifiers are, via a first wiring group provided on the first semiconductor substrate, respectively electrically connected to respective photodiodes of the first photodiode array, a second group of a plurality of the amplifiers are, via a second wiring group provided on the first semiconductor substrate and bumps respectively provided on the second wiring group, respectively electrically connected to respective photodiodes of the second photodiode array, in the second semiconductor substrate, an end portion close to the first photodiode array side has a stepped portion, the stepped portion has a first side surface and a second side surface along a thickness direction of the second semiconductor substrate, and a terrace surface located at a boundary between the first side surface and the second side surface and opposed to the first semiconductor substrate, each of the photodiodes composing the second photodiode array includes a semiconductor region of a first conductivity type, and a pixel region of a second conductivity type located at a surface layer side of a surface of the second semiconductor substrate opposed to the first semiconductor substrate, a depth of the terrace surface from an opposing surface of the second semiconductor substrate to the first semiconductor substrate is deeper than a depth of the pixel region of the second photodiode array, the first side surface is closer to the first semiconductor substrate than the second side surface, and a crystal defect density in the first side surface is lower than a crystal defect density in the second side surface.

Because the first semiconductor substrate and the second semiconductor substrate are different in material, the first photodiode array and the second photodiode array formed thereon have their sensitivities to incident light of mutually different wavelength bands. Because the respective photodiodes of the photodiode arrays are connected to the amplifiers, outputs of the first semiconductor substrate are output to the outside after amplification. Here, outputs of the photodiodes of the first semiconductor substrate are taken out to the outside via the first wiring group and the first group of amplifiers.

Outputs of the photodiodes of the second semiconductor substrate are input to the second group of amplifiers via the bumps and the second wiring group, and taken out to the outside via these amplifiers. Here, an end portion of the second semiconductor substrate has a stepped portion. The stepped portion includes a first side surface close to the first semiconductor substrate and a second side surface distant from the first semiconductor substrate, but the crystal defect density of the first side surface is relatively low, so that the harmful influence on the second photodiode array is reduced. That is, because approximating the second side surface and a closest photodiode of the second photodiode array to each other also suppresses degradation in output of this photodiode, it is not necessary to remove said photodiode. Accordingly, in such a structure, a reduction in the number of photodiodes per module can be suppressed.

Moreover, the photodiode array module according to the aspect of the present invention is characterized in that the first side surface is a surface formed by etching the second semiconductor substrate in its thickness direction, and the second side surface is a surface formed by dicing the second semiconductor substrate in its thickness direction. That is, the density of crystal defects in a side surface produced by etching is smaller than the density of crystal defects in a side surface produced by dicing.

Moreover, the photodiode array module according to the aspect of the present invention is characterized by including as the second group of amplifiers in the first semiconductor substrate a first outer amplifier group, and a second outer amplifier group, and in that the pixel regions are, along their array direction, electrically connected to one-side terminals of the first and the second outer amplifier groups alternately.

In this case, because the amplifiers are located on both sides of the respective pixel regions, the number of amplifiers disposed per unit length in the array direction of the pixel regions can be increased, and the pitch of the pixel regions can be narrowed to increase resolution.

Moreover, the photodiode array module according to the aspect of the present invention is characterized by further including a resin layer interposed between the first semiconductor substrate and the second semiconductor substrate. In this case, the bonding strength between the first and second semiconductor substrates can be enhanced.

Moreover, the photodiode array module according to the aspect of the present invention is characterized by further including on the first semiconductor substrate a damming member which, when the resin layer is formed, inhibits a material of the resin layer from flowing before curing, and in that the resin cures after formation. When there is a resin layer, there is a possibility of causing light attenuation, but when there is a damming member, entry of the resin into the first photodiode array can be suppressed.

Moreover, a method of manufacturing a photodiode array module according to an aspect of the present invention is a method of manufacturing a photodiode array module including a first semiconductor substrate formed with a plurality of amplifiers, made of a first semiconductor material, and a second semiconductor substrate adhered to the first semiconductor substrate, made of a second semiconductor material, on which light is incident from the second semiconductor substrate side, and is characterized by including a step of forming a first photodiode array on the first semiconductor substrate, a step of forming a second photodiode array on the second semiconductor substrate, a step of, by forming first and second wiring groups via an insulating layer on the first semiconductor substrate, electrically connecting respective pixel regions of the first photodiode array and a first group of the amplifiers via the first wiring group and electrically connecting the second wiring group and a second group of the amplifiers, a step of etching a wafer including the second semiconductor substrate up to a position deeper than a pixel region of the second photodiode array to form an etched groove including a side surface of the second semiconductor substrate, a step of separating the second semiconductor substrate from the wafer by dicing a deepest portion of the etched groove, and a step of adhering the first semiconductor substrate and the second semiconductor substrate to each other, disposing the second photodiode array on the second wiring group via bumps, and electrically connecting the second wiring group and each of the pixel regions of the second photodiode.

According to this method, the second semiconductor substrate is separated from the wafer by etching the second semiconductor substrate and then dicing a deepest portion of the etched groove. The density of crystal defects in a side surface produced by etching is smaller than the density of crystal defects in a side surface produced by dicing. Because the photodiode located in the end portion of the second semiconductor substrate does not need to be removed, a reduction in the number of photodiodes can be suppressed.

The method of manufacturing a photodiode array module according to the aspect of the present invention is characterized by further including a step of interposing a resin layer between the first semiconductor substrate and the second semiconductor substrate. In this case, the bonding strength between the first and second semiconductor substrates can be enhanced.

The method of manufacturing a photodiode array module according to the aspect of the present invention is characterized by including a step of forming a damming member on the first semiconductor substrate, a step of, when forming the resin layer, interposing a material of the resin layer between the first semiconductor substrate and the second semiconductor substrate, and inhibiting the material from flowing by the damming member, and a step of curing the resin layer material. In this case, because the damming member inhibits the martial of the resin layer from flowing, entry of the resin into the first photodiode array can be suppressed, and light attenuation in the first photodiode array can be suppressed.

Advantageous Effects of Invention

According to the aspect of the present invention, a photodiode array module in which a reduction in the number of photodiodes PD per module is suppressed and a method of manufacturing the same can be provided.

DESCRIPTION OF EMBODIMENTS

Hereinafter, a photodiode array module and a method of manufacturing the same according to an embodiment will be described. Also, the same components will be denoted by the same reference signs, and overlapping description will be omitted.

Figure 1:
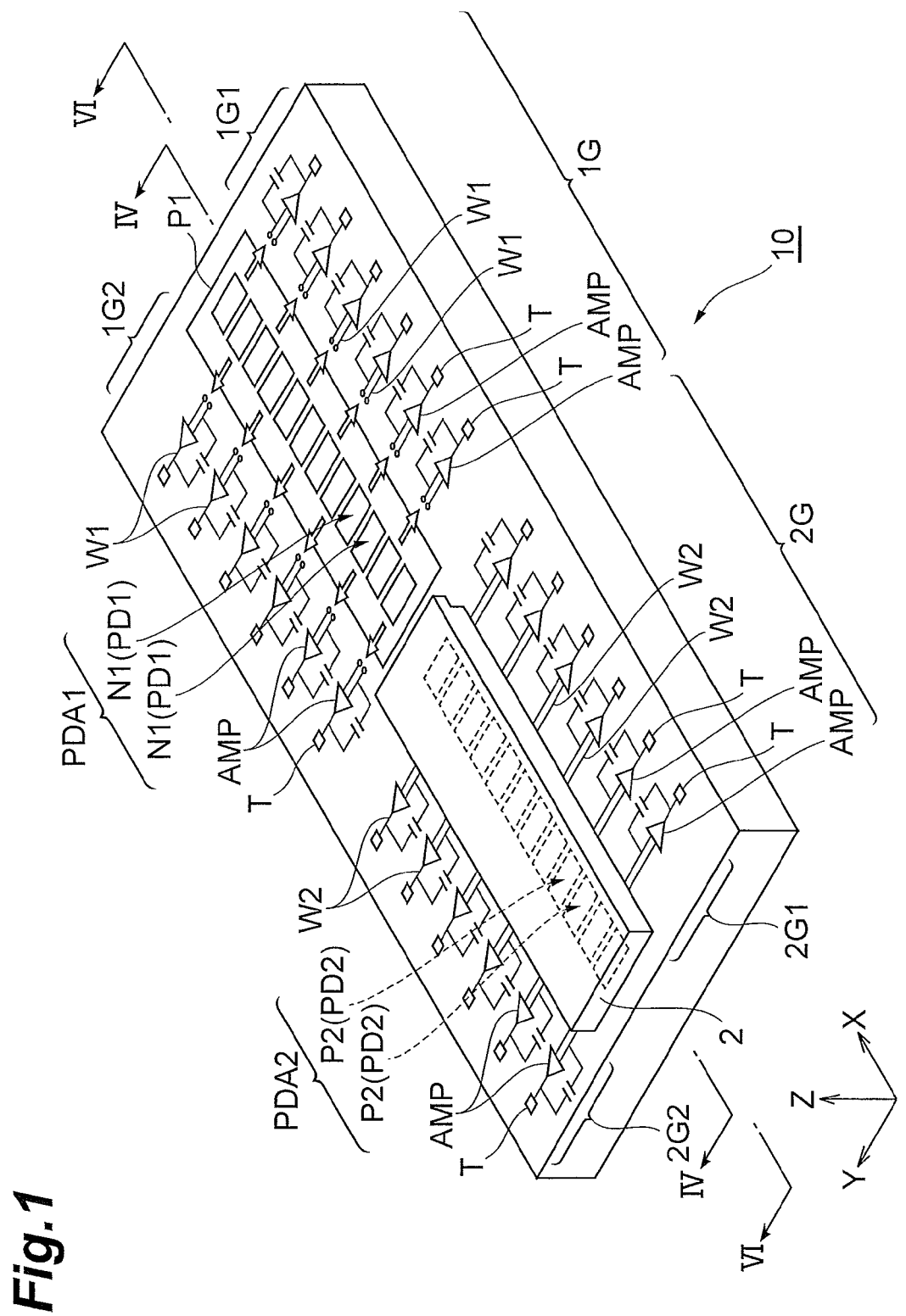
FIG. 1 is a perspective view of a photodiode array module.

FIG. 1 is a perspective view of the photodiode array module according to the embodiment.

The photodiode array module 10 includes a first semiconductor substrate 1 made of a first semiconductor material (Si) and a second semiconductor substrate 2 made of a second semiconductor material (InGaAs). Because the first semiconductor material (Si) and the second semiconductor material (InGaAs) are different, the photosensitive wavelength bands of these are different. To a front surface of the first semiconductor substrate 1, a front surface of the second semiconductor substrate 2 is adhered. On the first semiconductor substrate 1, a plurality of amplifiers AMP to which outputs from respective photodiodes are input are formed.

A three-dimensional rectangular coordinate system is set whose Z-axis is in a thickness direction of the first semiconductor substrate 1, whose X-axis is in an array direction of photodiodes, and whose Y-axis is in a direction perpendicular to both of the Z-axis and X-axis. The X-axis corresponds to the longitudinal direction of the semiconductor substrates 1, 2, and the Y-axis corresponds to the width direction of the semiconductor substrates 1, 2. A light to be made incident on the photodiode array module 10 proceeds in a −Z-direction. That is, light is incident on the module 10 from the second semiconductor substrate 2 side. The light is incident from a back surface side of the second semiconductor substrate 2, photoelectric conversion is performed in a photosensitive region located at its front surface side, and an output is taken out via bumps and a wiring group. Onto the first semiconductor substrate 1, light is made incident from a front surface side, photoelectric conversion is performed in a photosensitive region located at the front surface side, and an output is taken out via bumps and a wiring group.

The first semiconductor substrate 1 has a first photodiode array PDA1, and the second semiconductor substrate 2 has a second photodiode array PDA2. The second photodiode array PDA2 is located at the side of a surface opposed to the first semiconductor substrate 1 in the second semiconductor substrate 2.

All amplifiers AMP are formed within the first semiconductor substrate 1, but these amplifiers AMP will be divided into several groups and defined.

A first group 1G of a plurality of amplifiers AMP is a group electrically connected to the first photodiode array PDA1. That is, the first group 1G of amplifiers AMP are, via a first wiring group W1 provided by patterning on the first semiconductor substrate 1, respectively electrically connected to the respective photodiodes of the first photodiode array PDA1. A well region P1 formed in a surface layer of the first semiconductor substrate 1 extends along the X-axis, and constructs one-side electrodes (anodes) of photodiodes PD1, and pixel regions N1 construct the other-side electrodes (cathodes). These anodes and cathodes are connected with the first wiring group W1, and are respectively connected to a reference potential Vref and inverting input terminals (−) of the amplifiers AMP on a photodiode-by-photodiode basis. Moreover, non-inverting input terminals (+) of the amplifiers AMP are connected with an external power supply Vext. (Refer to FIG. 2.)

A second group 2G of a plurality of amplifiers AMP is a group electrically connected to the second photodiode array PDA2. That is, the second group 2G of amplifiers AMP are, via a second wiring group W2 provided by patterning on the first semiconductor substrate 1 and bumps respectively provided on the second wiring group W2, respectively electrically connected to the respective photodiodes of the second photodiode array PDA2. A pair of common wirings CW2(1), CW2(2) (refer to FIG. 3) formed via an insulating layer on the front surface of the second semiconductor substrate 2 are electrically connected to a semiconductor region of a first conductivity type (N type), extend along the X-axis, and construct one-side electrodes (cathodes) of photodiodes PD2, and pixel regions P2 construct the other-side electrodes (anodes). These cathodes and anodes are connected with the second wiring group W2, and are respectively connected to the non-inverting input terminals (+) and inverting input terminals (−) of the amplifiers AMP on a photodiode-by-photodiode basis (refer to FIG. 2).

Figure 2:
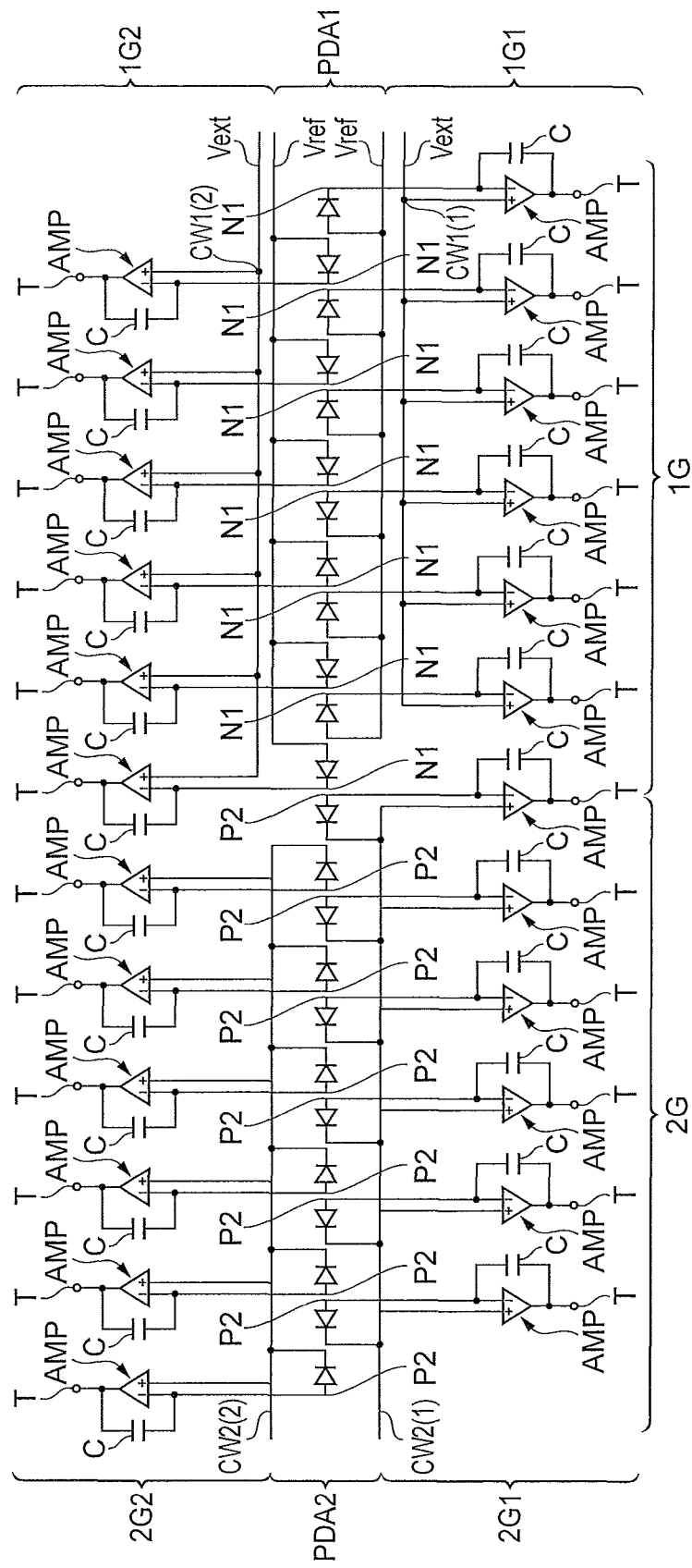
FIG. 2 is a circuit diagram of the photodiode array module.

FIG. 2 is a circuit diagram of the photodiode array module.

Referring to FIG. 1 and FIG. 2, the amplifiers AMP are located on both sides of the photodiode arrays PDA1, PDA2. The array direction of the amplifiers AMP is parallel to the X-axis, and both groups 1G, 2G of amplifiers AMP are coincident in the array direction of the amplifiers AMP. The respective photodiodes PD1, PD2 are arrayed along the X-direction, and located on the same line. With reference to the array direction of the photodiodes PD1, PD2, amplifier groups located on one side are provided as 1G1, 2G1, and amplifier groups 1G2, 2G2 located on the other side are provided as 1G2, 2G2. In the case of PDA2, because the substrate on which the photodiode array is formed is different from that of the amplifiers, the amplifiers do not need to be disposed on both sides of the PDA2, and it suffices that the amplifiers are divided into two groups.

Figure 3:
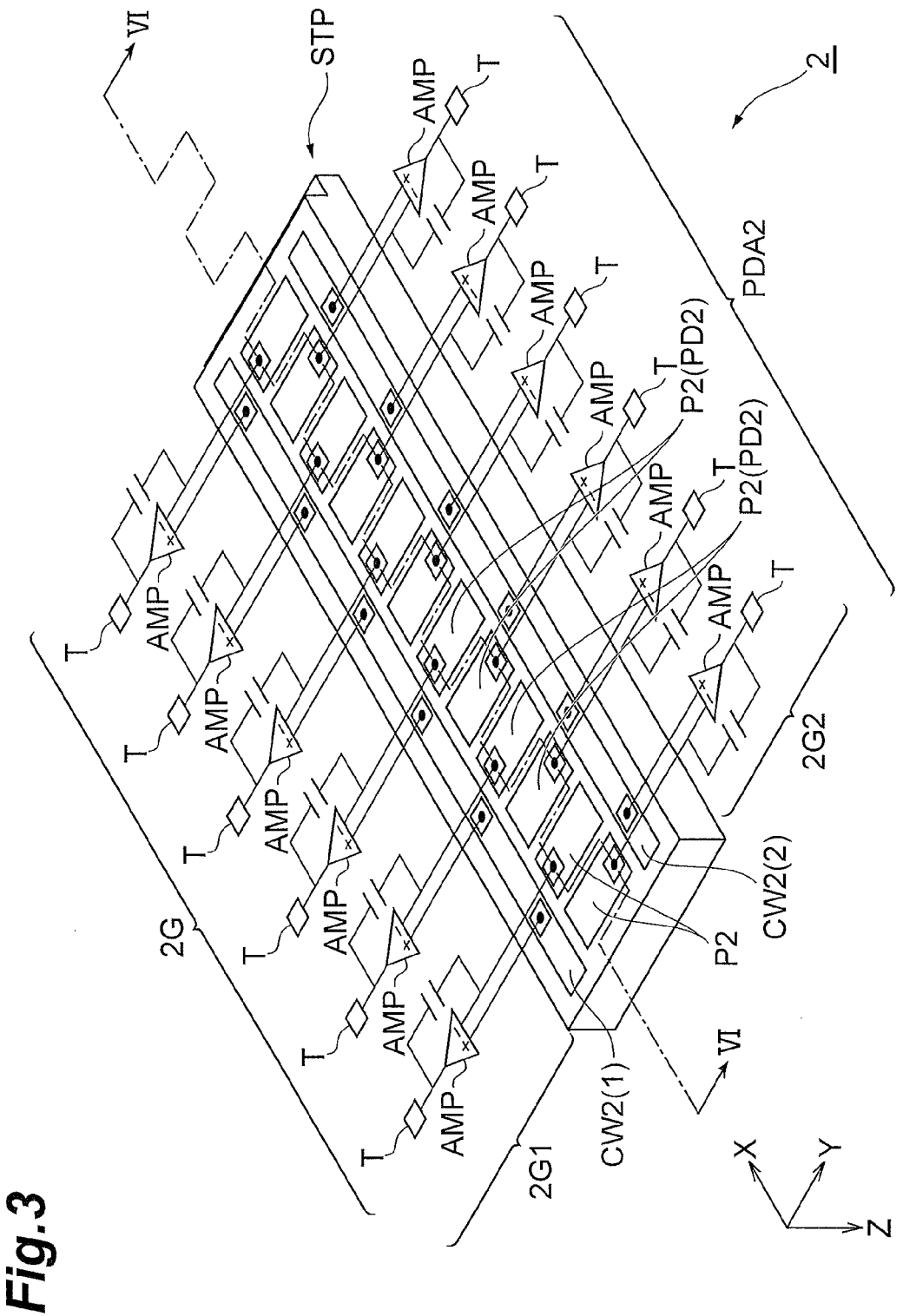
FIG. 3 is a perspective view of a second semiconductor substrate.

FIG. 3 is a perspective view of the second semiconductor substrate 2. The second semiconductor substrate 2 shown in FIG. 3 is shown inverted upside down from the one shown in FIG. 1. Moreover, FIG. 4 is a sectional view taken along arrows IV-IV of the photodiode array module shown in FIG. 1, and FIG. 5 is an enlarged view of a region V of the photodiode array module shown in FIG. 4.

The second semiconductor substrate 2 has a stepped portion STP at an end portion close to the first photodiode array (PDA1) side. The stepped portion STP, referring to FIG. 4 or FIG. 5, has a first side surface S1 and a second side surface S2 along the thickness direction (Z-axis) of the second semiconductor substrate 2 and a terrace surface ST located at the boundary between the first side surface S1 and the second side surface S2 and opposed to the first semiconductor substrate 1. The front surface, back surface, and terrace surface ST of the first semiconductor substrate 2 are XY planes, and the first side surface S1 and the second side surface S2 are both YZ planes.

Figure 4:
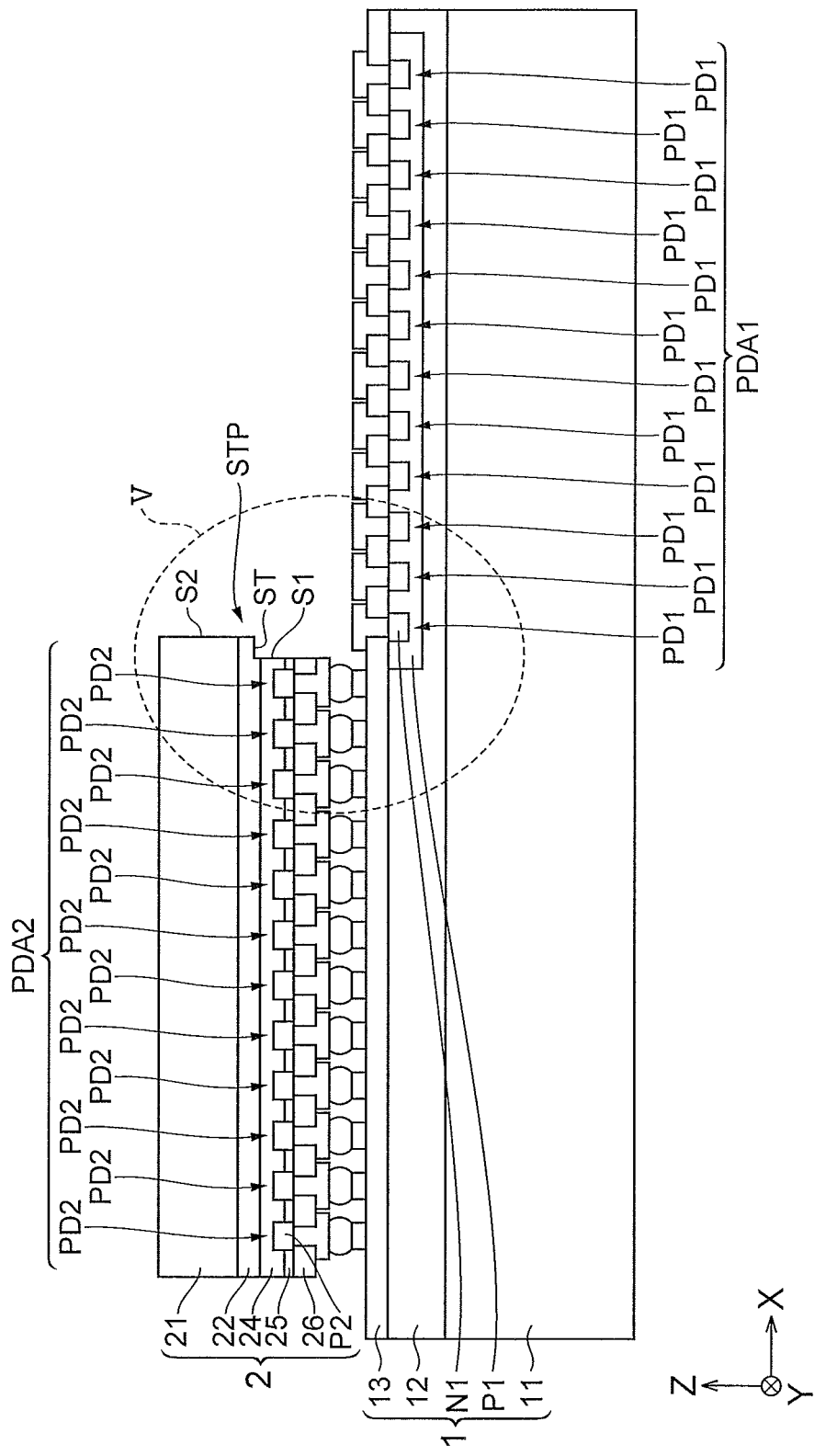
FIG. 4 is a sectional view taken along arrows IV-IV of the photodiode array module shown in FIG. 1.
Figure 5:
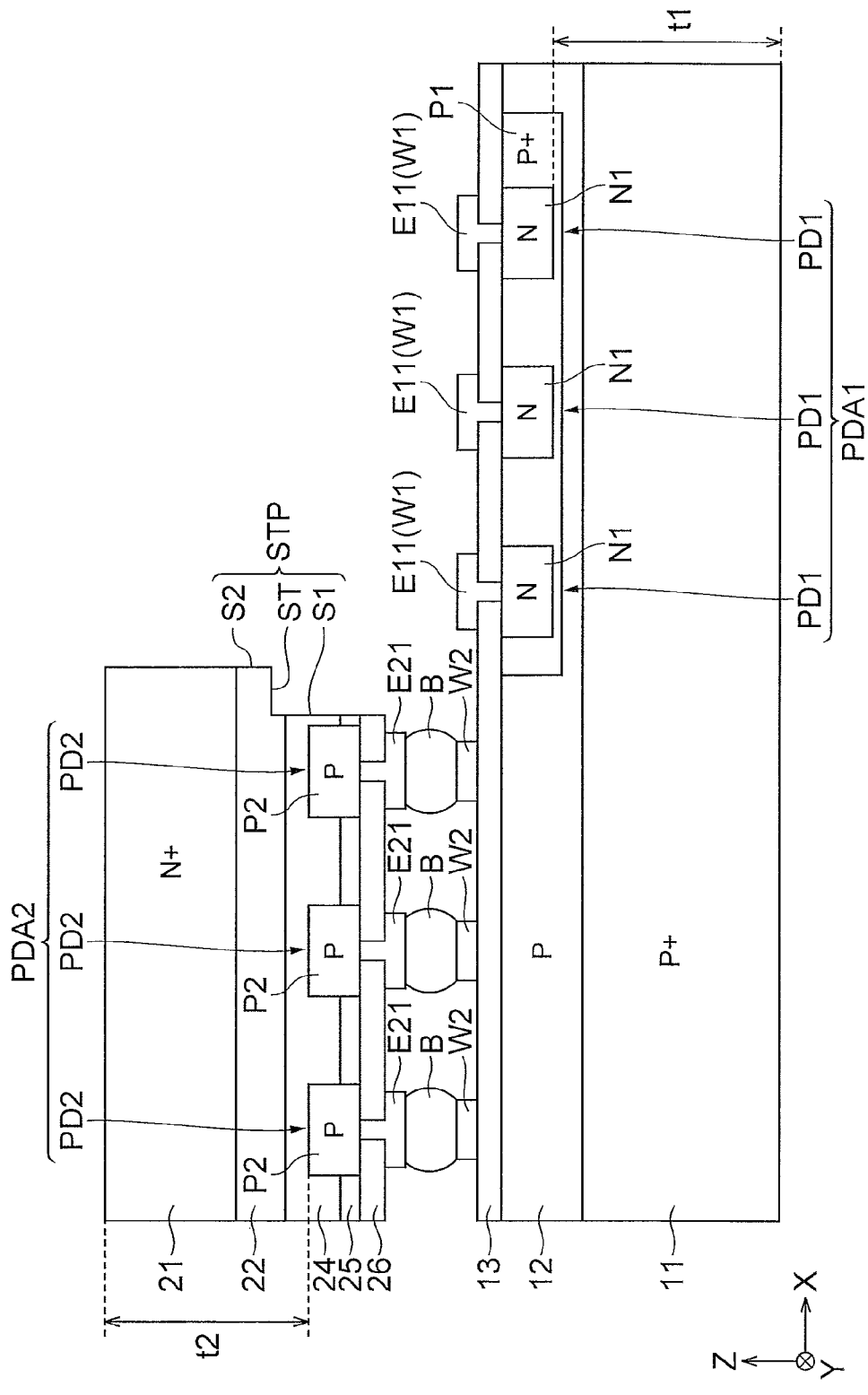
FIG. 5 is an enlarged view of a region V of the photodiode array module shown in FIG. 4.

As shown in FIG. 4, the first photodiode array PDA1 includes a plurality of photodiodes PD1 aligned along the X-axis direction, and the second photodiode array PDA2 also includes a plurality of photodiodes PD2 aligned along the X-axis direction. Also, FIG. 4 is indeed a sectional view taken along an arrow line IV-IV of the module shown in FIG. 1, but this section is accurately a section in the case of an arrow line VI-VI for which an arrow line IV-IV is drawn zigzag, as shown in FIG. 3.

Figure 6:
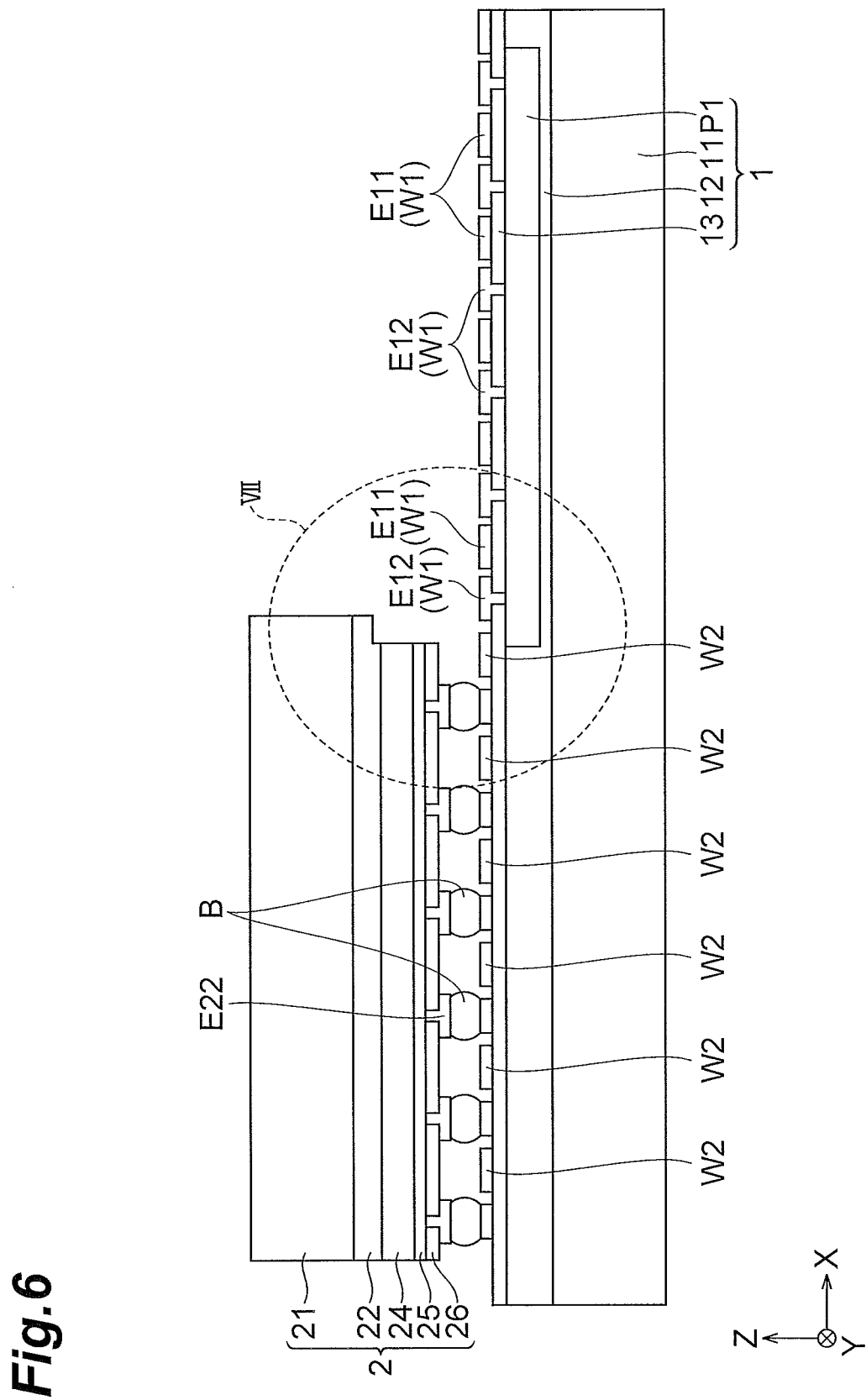
FIG. 6 is a sectional view taken along arrows VI-VI of the photodiode array module shown in FIG. 1.
Figure 7:
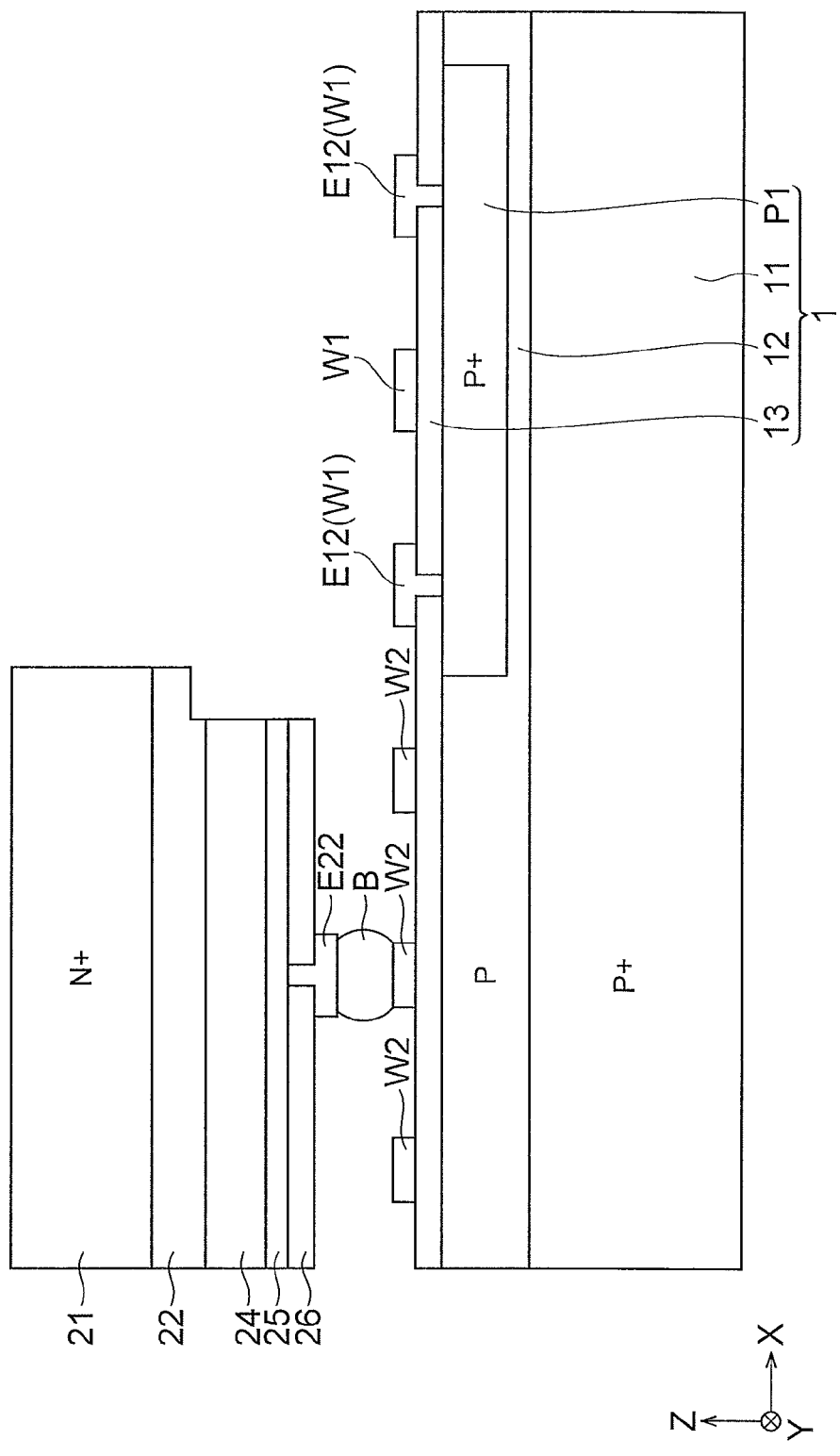
FIG. 7 is an enlarged view of a region VII of the photodiode array module shown in FIG. 6.

Moreover, FIG. 6 is a sectional view taken along arrows VI-VI of the photodiode array module shown in FIG. 1, and FIG. 7 is an enlarged view of a region VII of the photodiode array module shown in FIG. 6.

Referring to FIG. 4 and FIG. 7, the first semiconductor substrate 1 includes a semiconductor substrate 11 having a high impurity concentration, an epitaxial layer 12 serving as a light absorbing layer formed on the semiconductor substrate 11, a well region P1 (refer to FIG. 6) formed in the epitaxial layer 12 and having an impurity concentration higher than that of the epitaxial layer 12, and pixel regions N1 formed in the well region P1 formed in the epitaxial layer 12.

On the epitaxial layer 12 of the front surface, an insulating layer 13 made of $SiO_2$ or $SiN_X$ is formed, into contact holes provided in the insulating layer 13, contact electrodes E11 are embedded, and the contact electrodes E11 are connected with patterned wirings W1. In FIG. 4 and FIG. 5, the contact electrodes E11 and the wirings W1 are integrally shown. In actuality, the contact electrodes E11 and the wirings W1 can indeed be manufactured by a common material and process, but these may be manufactured by separate materials and/or processes.

The material/conductivity type/thickness (range)/impurity concentration (range) of the respective layers in the first semiconductor substrate 1 are as follows. Also, as an N-type impurity into Si, a quinquevalent element (N, P, or As) can be used, and as a P-type impurity, a triad element (B or Al) can be used.

Semiconductor substrate 11: Si/P type/200~800 µm/1× $10^{16}$~1×$10^{18}$ cm$^{-3}$ Epitaxial layer 12: Si/P type/5~20 µm/1×$10^{15}$~1×$10^{17}$ cm$^{-3}$ Well region P1: Si/P type/1~10 µm/1×$10^{16}$~1×$10^{19}$ cm$^{-3}$ Pixel region N1: Si/N type/0.1~2 µm/1×$10^{17}$~1×$10^{20}$ cm$^{-3}$ Each photodiode PD1 in the first semiconductor substrate 1 includes the well region P1-epitaxial layer 12 of a second conductivity type (P type) and the pixel region N1 made of a semiconductor of the first conductivity type (N type) located at a surface layer side of a surface of the well region P1-epitaxial layer 12 close to the second semiconductor substrate 2 side. The plurality of pixel regions N1 are aligned along the X-axis, and intermittently arrayed up to a position before leading to a region directly under the second semiconductor substrate 2. The interface between the N-type semiconductor region N1 and the P-type semiconductor region 12 constructs a p-n junction, and a depletion layer spreads from the p-n junction interface.

With no bias voltage applied to the photodiode PD1, because the depletion layer is generated by recombination of holes and electrons in the vicinity of the p-n junction plane, the dimensions of the depletion layer depend on the impurity concentrations in the pixel region N1 and the well region P1 to supply holes and electrons. Because the depletion layer has photosensitive properties, if this depletion layer spreads up to a region where noise is generated, noise is likely to be superimposed on an output of the photodiode PD1. In the present example, directly under the epitaxial layer 12, the semiconductor layer 11 having an impurity concentration higher than that of the epitaxial layer 12 is located to restrict the depletion layer from spreading.

Moreover, the well region P1 that constructs anodes is shown in FIG. 7, while there is located an insulating layer 13 on the well region P1, and into contact holes provided in the insulating layer 13, contact electrodes E12 are embedded, and the well region P1 to serve as anodes is, via the contact electrodes E12 and wirings W1 connected to these, connected to the reference potential Vref (refer to FIG. 2). In FIG. 7, the contact electrodes E12 and the wirings W1 are integrally shown. In actuality, the contact electrodes E12 and the wirings W1 can indeed be manufactured by a common material and process, but these may be manufactured by separate materials and/or processes. Also, in the same figure, a state in which the wiring W1 extending from the contact electrode E11 (refer to FIG. 5) is located on the insulating layer 13, and the contact electrodes E11 are connected to the inverting input terminals (−) of the amplifiers AMP (refer to FIG. 2).

Moreover, the second semiconductor substrate 2 includes a semiconductor substrate 21 having a high impurity concentration, a buffer layer 22 formed on the semiconductor substrate 21, a light absorbing layer 24 formed on the buffer layer 22, and a cap layer 25 formed on the light absorbing layer 24. Further, the second semiconductor substrate 2 includes pixel regions P2 (refer to FIG. 5) of the second conductivity type (P type) formed in the cap layer 25 and the light absorbing layer 24.

On the cap layer 25 of the front surface, an insulating layer 26 made of $SiO_2$ or $SiN_X$ is formed, into contact holes provided in the insulating layer 26, contact electrodes E21 are embedded, and the contact electrodes E21 are connected with patterned wirings W2 physically and electrically via bumps B. The wirings W2 are located on the insulating layer 13.

The material/conductivity type/thickness (range)/impurity concentration (range) of the respective layers in the second semiconductor substrate 2 are as follows. Also, as an N-type impurity into InGaAs or InP, S or Si can be used, and as a P-type impurity, Zn can be used.

Semiconductor substrate 21: InP/N type/100~1000 µm/1× $10^{17}$~1×$10^{20}$ cm$^{-3}$ Buffer layer 22: InP/N type/1~10 µm/1×$10^{17}$~1×$10^{20}$ cm$^{-3}$ Light absorbing layer 24: InGaAs/N type/1~7 µm/1× $10^{15}$~1×$10^{17}$ cm$^{-3}$ Cap layer 25: InP/N type/0.1~2 µm/1×$10^{16}$~1×$10^{18}$ cm$^{-3}$ Pixel region P2: InP/InGaAs/P type/0.1~3 µm/1×$10^{17}$~1× $10^{19}$ cm$^{-3}$ Each photodiode PD2 in the second semiconductor substrate 2 includes the semiconductor region 24, 25 of the first conductivity type (N type) and the pixel region P2 made of a semiconductor of the second conductivity type (P type) located at a surface layer side of a surface of the semiconductor region 24, 25 opposed to the first semiconductor substrate 1. The plurality of pixel regions P2 are aligned along the X-axis, and intermittently arrayed up to a position before leading to an end portion close to the first semiconductor substrate 1 side. The interface between the P-type semiconductor region P2 and the N-type semiconductor region 24, 25 constructs a p-n junction, and a depletion layer spreads from the p-n junction interface.

With no bias voltage applied to the photodiode PD2, because the depletion layer is generated by recombination of holes and electrons in the vicinity of the p-n junction plane, the dimensions of the depletion layer depend on the impurity concentrations in the pixel region P2 and the semiconductor region 24 to supply holes and electrons. Because the depletion layer has photosensitive properties, if this depletion layer spreads up to a region where noise is generated, noise is likely to be superimposed on an output of the photodiode PD2. Particularly, in the end portion close to the first photodiode array side in the second semiconductor substrate 2, because there is damage introduced during dicing, it is preferable to suppress noise to be generated in such a place.

In a photodiode, the response speed can be improved by decreasing junction capacitance to be defined by a depletion layer simultaneously with controlling spreading of said depletion layer. If a non-doped layer is used between the buffer layer 22 and the light absorbing layer 24, the thickness of the depletion layer increases, so that the junction capacitance decreases, and accordingly, it also becomes possible in this device to improve the response speed.

In the present example, directly under the light absorbing layer 24 (in the figure, the positive Z-axis direction is assumed as a direction being directly under regarding the second semiconductor substrate 2), the buffer layer 22 and the semiconductor substrate 21 having an impurity concentration higher than that of the light absorbing layer 24 is located to restrict the depletion layer from spreading in the thickness direction. Moreover, in the end portion of the second semiconductor substrate 2, dicing is performed using a diamond-made dicing blade in a region outside the depletion layer. That is, the first side surface S1 in the end portion is formed by etching, and the first side surface S1 exists in terms of the depth in the Z-axis direction thereof at a position deeper than that of the light absorbing layer 24. In the example described above, the first side surface S1 reaches the buffer layer 22, but this may be provided so as to reach the substrate 21. Because the second side surface S2 having a high crystal defect density is located outside the depletion layer serving as a carrier generating region, even when the pixel region P2 is brought close to the substrate end portion, a noise component to be mixed with an output signal can be suppressed.

Particularly, during dicing, the side surface easily produces a shell crack, and this functions as a major defect, but because the second side surface S2 exists at a position separated from the pixel region P2, cracks and noise in the pixel region P2 caused by the shell crack can also be suppressed. Also, when a shell crack is generated, a range where current easily flows approximates an impurity diffusion part serving as the pixel region P2, and in the case of not using etching, depending on the size of the shell crack, the range may cause a short-circuit with this diffusion part or reach a very close position, and the depletion layer may even reach the shell crack part when a bias is applied. Moreover, even when insulation between the shell crack and diffusion region has been maintained initially, an electrical short-circuit easily occurs due to ionization of moisture under a high humidity environment, and there is a concern for a short life. On the other hand, in the above-described embodiment, because the position to generate a shell crack is separated, these problems are suppressed.

The terrace surface ST located in the end portion of the second semiconductor substrate 2 is located at a deepest portion of the first side surface S1. The depth of the terrace surface ST from the opposing surface of the second semiconductor substrate 2 to the first semiconductor substrate is deeper than the depth of at least the pixel region P2 of the second photodiode array. This is because, when the depth of the terrace surface ST is shallower than that of the pixel region P2, the second side surface S2 having a high crystal defect density comes to be adjacent laterally to the pixel region P2, and noise is mixed therein. The deeper the position the terrace surface ST exists at, the smaller the influence of noise is exerted, but because an etching step takes a longer time than that of a dicing step, dicing is performed from a spot to have smaller influence of noise due to a defect so as to cut the substrate. Thus, the first side surface S1 exists at a position closer to the first semiconductor substrate 1 than the second side surface S2, but using etching allows making the crystal defect density in the first side surface S1 lower than the crystal defect density in the second side surface S2, which then allows bringing the pixel region P2 close to the first side surface S1 with suppressed noise.

It becomes possible to set the closest distance from the first side surface S1 to the pixel region P2 to 3 μm or more.

Referring to FIG. 3, a structure of the second semiconductor substrate 2 will be explained in detail.

The common wirings CW2(1), CW2(2) that are electrically connected to a semiconductor region of the first conductivity type (N type) to construct cathodes of the second photodiode array PDA2 include the first common wiring CW2(1) extending in a direction along which the above-mentioned pixel region is arrayed in plural numbers and the second common wiring CW2(2) extending parallel to the first common wiring CW2(1).

Moreover, the semiconductor region 22, 24, 25 of the first conductivity type that constructs cathodes is shown also in FIG. 7, while there is located an insulating layer 26 on the cap layer 25 serving as a semiconductor region, and into contact holes provided in the insulating layer 26, contact electrodes E22 are embedded, and the semiconductor region is, via the contact electrodes E22 and wirings W2 connected to these via bumps B, connected to the non-inverting input terminals (+) of the amplifiers AMP (refer to FIG. 2). Also, in the same figure, a state is shown in which the wirings W2 extending from the contact electrodes E21 (refer to FIG. 5) are located on the insulating layer 13, and the contact electrodes E21 are connected to the inverting input terminals (−) of the amplifiers AMP (refer to FIG. 2). This longitudinal sectional structure is of a section taken through the well region P1(1) (refer to FIG. 1) and the first common wiring CW2(1) (refer to FIG. 3), but a sectional structure taken through the well region P1(2) (refer to FIG. 1) and the second common wiring CW2(2) (refer to FIG. 3) is also the same.

Referring again to FIG. 3, the pixel regions P2 are located in a region between the first common wiring CW2(1) and the second common wiring CW2(2). Also, the amplifiers AMP are formed on the first semiconductor substrate 1.

Referring to FIG. 1 to FIG. 3, the second group 2G of amplifiers AMP on the first semiconductor substrate 1 includes a first outer amplifier group 2G1 and a second outer amplifier group 2G2. The first outer amplifier group 2G1 is located outside further than the region (refer to FIG. 3) between the first common wiring CW2(1) and the second common wiring CW2(2), and similarly, the second outer amplifier group 2G2 is located outside further than the region between the first common wiring CW2(1) and the second common wiring CW2(2).

The first outer amplifier group 2G1 is located at a position closer to the first common wiring CW2(1) than the second common wiring CW2(2), and the second outer amplifier group 2G2 is located at a position closer to the second common wiring CW2(2) than the first common wiring CW2(1).

The pixel regions P2 are, along their array direction (X-axis), electrically connected to one-side terminals (−) of the first outer amplifier group 2G1 and the second outer amplifier group 2G2 alternately. That is, the first pixel region P2 from the left in FIG. 3 is connected to the inverting terminal (−) of the amplifier AMP of the second outer amplifier group 2G2, the second pixel region P2 is connected to the inverting terminal (−) of the amplifier AMP of the first outer amplifier group 2G1, the third pixel region P2 is connected to the inverting terminal (−) of the amplifier AMP of the second outer amplifier group 2G2, and the fourth pixel region P2 is connected to the inverting terminal (−) of the amplifier AMP of the first outer amplifier group 2G1. Where MOD (N,2)+1=k, the N-th pixel region P2 from the left is connected to the inverting terminal (−) of the amplifier AMP of the k-th outer amplifier group 2Gk. Also, MOD (N,2) is an operator indicating a remainder when N is divided by 2.

Moreover, the other-side terminals (+) of the first outer amplifier group 2G1 and the other-side terminals (+) of the second outer amplifier group 2G2 are electrically connected to the common wirings CW2(1) and CW2(2), respectively. The patterned wirings W2 are used for connections between the amplifiers AMP and the respective regions of the photodiodes PD2.

In the foregoing structure, because the amplifiers AMP are located on both sides of the respective pixel regions P2, the number of amplifiers disposed per unit length in the array direction of the pixel regions P2 can be increased, and the pitch of the pixel regions P2 can be narrowed to increase resolution.

Also, the foregoing connection arrangement between the pixel regions and amplifiers is the same also in the first semiconductor substrate 1. Referring to FIG. 1, a structure of the first semiconductor substrate 1 will also be explained in detail.

The P-type well region P1 that constructs anodes of the first photodiode array PDA1 has a size large enough to contain the plurality of pixel regions N1.

The N-type pixel regions N1 to serve as cathodes are located within the region of the well region P1. Similar to the pixel regions N1, the amplifiers AMP are also formed on the first semiconductor substrate 1.

Referring to FIG. 1 and FIG. 2, the first group 1G of amplifiers AMP on the first semiconductor substrate 1 includes a first outer amplifier group 1G1 and a second outer amplifier group 1G2. The first outer amplifier group 1G1 is located outside further than the region (refer to FIG. 1) of the well region P1. Similarly, the second outer amplifier group 1G2 is located outside further than the region of the well region P1.

The first outer amplifier group 1G1 is located at a position closer to a second well electrode group CW1(1) than a second well electrode group CW1(2), and the second outer amplifier group 1G2 is located at a position closer to the second well electrode group CW1(2) than the first well electrode group CW1(1). The electrode groups CW1(1), CW(2) are common to the electrodes E12, and are applied with the reference potential Vref.

The pixel regions N1 are, along their array direction (X-axis), electrically connected to one-side terminals (−) of the first outer amplifier group 1G1 and the second outer amplifier group 1G2 alternately (refer to FIG. 2). That is, the first pixel region N1 from the left in the first group 1G of FIG. 2 is connected to the inverting terminal (−) of the amplifier AMP of the second outer amplifier group 1G2, the second pixel region N1 is connected to the inverting terminal (−) of the amplifier AMP of the first outer amplifier group 1G1, the third pixel region N1 is connected to the inverting terminal (−) of the amplifier AMP of the second outer amplifier group 1G2, and the fourth pixel region N1 is connected to the inverting terminal (−) of the amplifier AMP of the first outer amplifier group 1G1. Where MOD (N,2)+1=k, the N-th pixel region N1 from the left is connected to the inverting terminal (−) of the amplifier AMP of the k-th outer amplifier group 1Gk. Also, MOD (N,2) is an operator indicating a remainder when N is divided by 2.

Moreover, the other-side terminals (+) of the first outer amplifier group 1G1 and the other-side terminals (+) of the second outer amplifier group 1G2 are respectively electrically connected to the external power supply Vext (refer to FIG. 2). The patterned wirings W1 are used for connections between the amplifiers AMP and the respective regions of the photodiodes PD1.

In the foregoing structure, because the amplifiers AMP are located on both sides of the respective pixel regions N1, the number of amplifiers disposed per unit length in the array direction of the pixel regions N1 can be increased, and the pitch of the pixel regions N1 can be narrowed to improve resolution.

Moreover, in the foregoing structure, outputs of all of the respective amplifiers AMP can be taken out from terminals T, but the respective terminals T can also be connected to a circuit (a shift register) that converts a parallel output from a plurality of terminals T to a serial output. Moreover, as shown in FIG. 2, between the input and output terminals of each amplifier AMP, a capacitor C is interposed, which allows converting an output charge to a voltage. That is, the amplifiers AMP are charge amplifiers, and the amplifiers AMP are operational amplifiers, and there is a virtual short-circuit between the two input terminals of each. Accordingly, the respective photodiodes PD1, PD2 can be driven at zero bias, which allows restricting a depletion layer from spreading excessively. In terms of the structure of operational amplifiers, various types of operational amplifiers such as ones using CMOS can be used.

As in the foregoing, in the first photodiode array PDA1, because the semiconductor substrate is made of Si, noise to be generated in the semiconductor substrate is small, and accordingly, the photodiodes PD1 are connected to the operational amplifiers so as to amplify variations in cathode potential of the photodiodes PD1 relative to an external power supply potential, and the structure is thus simplified. On the other hand, because the second photodiode array PDA2 is made of a compound semiconductor, noise to be generated in the semiconductor substrate is large, and accordingly, it is preferable to perform differential amplification having a noise reduction effect. Of course, the configuration for differential amplification can also be applied to the first photodiode array PDA1. In the following, description will be given of an example of the amplifiers AMP in the case of such a structure.

Figure 14:
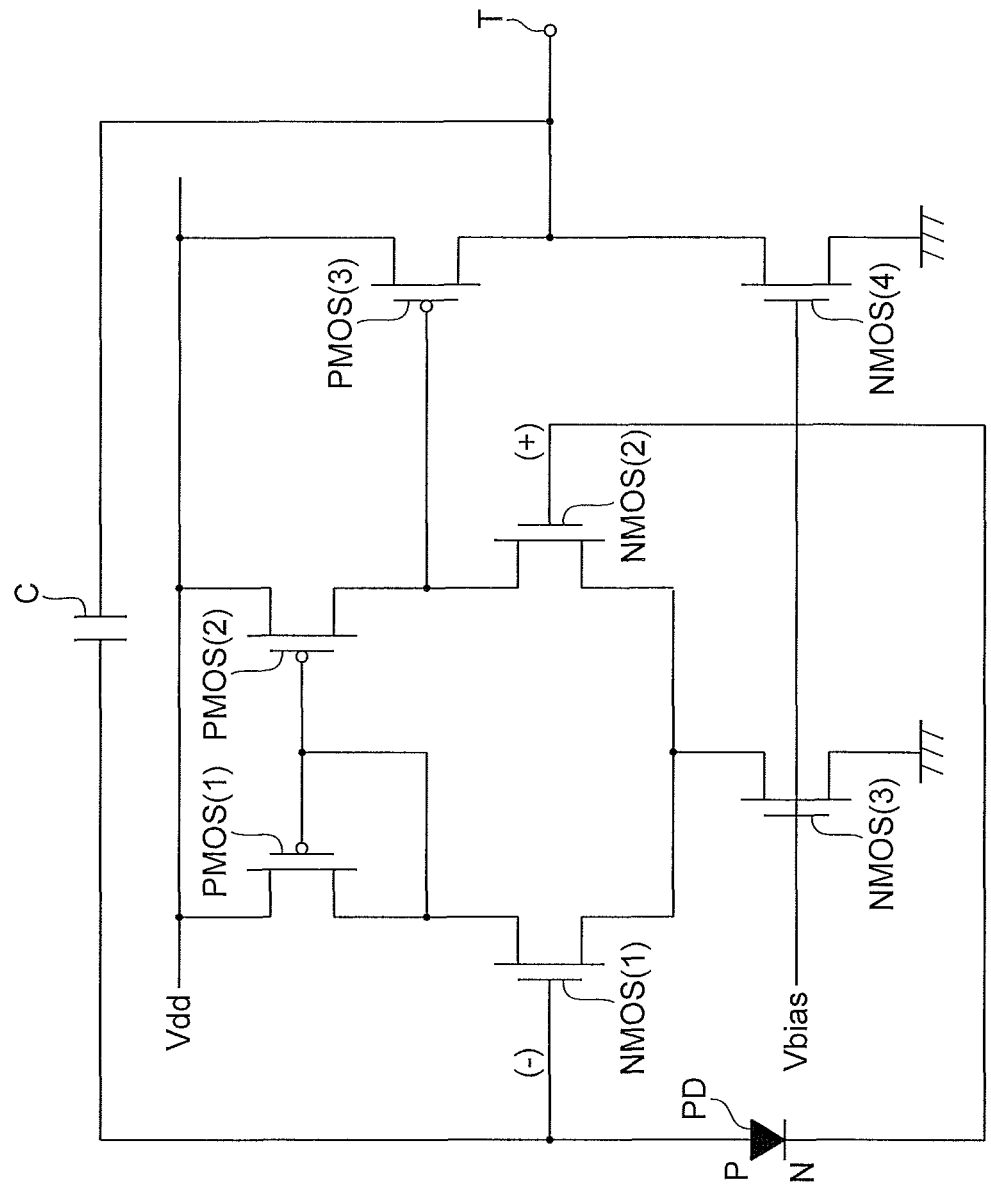
FIG. 14 is a circuit diagram showing an example of an amplifier.

FIG. 14 is a circuit diagram showing an example of the amplifiers AMP. The anode of the foregoing photodiode PD (PD2) is connected to the inverting input terminal (−), and the cathode is connected to the non-inverting input terminal (+). An operational amplifier is constructed by connecting the P-channel field-effect transistor PMOS and the N-channel field-effect transistor NMOS as illustrated. The operational amplifier is connected with a power supply line Vdd and a ground potential, and the gates of the NMOS(3) and NMOS(4) adjacent to the ground potential are applied with a bias potential Vbias to provide a function as a constant current source. A potential difference generated between both ends of the photodiode PD is detected by a differential pair (NMOS(1), NMOS(2)), and from one of the transistors of a current mirror circuit (PMOS(1), PMOS(2)), a current larger than that of the other transistor is supplied, and an input potential difference is transmitted to the subsequent stage of an amplifier circuit (PMOS(3), NMOS(4)), and amplified and output from the terminal T. Also, it suffices to use ordinary methods as methods of manufacturing photodiodes, amplifiers, and capacitors. Of course, this configuration for differential amplification can also be adopted when the photodiode PD is PD1.

According to the above-described photodiode array module, because the first semiconductor substrate 1 and the second semiconductor substrate 2 are different in material, the first photodiode array PDA1 and the second photodiode array PDA2 formed thereon have their sensitivities to incident light of mutually different wavelength bands. In the case of the foregoing materials, the first photodiode array PDA1 includes Si as a light absorbing layer and the second photodiode array PDA2 includes InGaAs as a light absorbing layer, and therefore, the first photodiode array PDA1 and the second photodiode array PDA2 have their sensitivities to wavelengths of 190 nm to 1000 nm and 500 nm to 2600 nm, respectively.

Also, as shown in FIG. 5, the distance t2 from the back surface of the second semiconductor substrate 2 to the pixel regions P2 is shorter than the distance t1 from the back surface of the first semiconductor substrate 1 to the pixel region P1, which provides a configuration where light incident from the second semiconductor substrate 2 side is transmitted through the second semiconductor substrate 2 to be sufficiently made incident on a depletion layer near the pixel region P2.

As shown in FIG. 1, because the respective photodiodes PD1, PD2 of the photodiode arrays PDA1, PDA2 are connected to the amplifiers AMP, outputs of the photodiodes PD1, PD2 are output to the outside after amplification. Here, outputs of the photodiodes PD1 of the first semiconductor substrate 1 are taken out to the outside via the first wiring group W1 and the first group 1G of amplifiers AMP.

Outputs of the photodiodes of the second semiconductor substrate 2 are input to the second group 2G of amplifiers AMP via the bumps (B) and the second wiring group W2, and taken out to the outside via these amplifiers AMP. Here, an end portion of the second semiconductor substrate 2 has a stepped portion STP. The stepped portion STP includes a first side surface S1 close to the first semiconductor substrate 1 and a second side surface S2 distant from the first semiconductor substrate 1, but the crystal defect density of the first side surface S1 is low relative to the crystal defect density of the second side surface S2, so that the harmful influence on the second photodiode array PDA2 is reduced.

Figure 8:
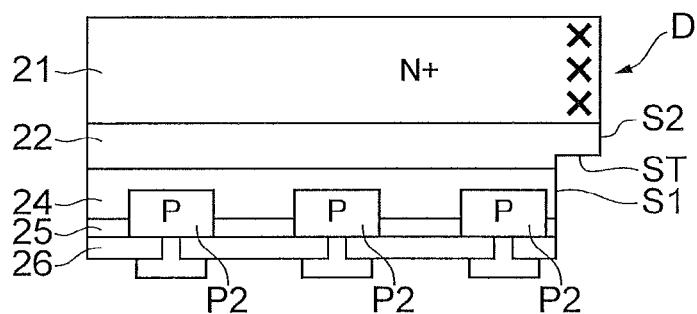
FIG. 8 includes views for explaining the effect of a stepped portion of a second semiconductor substrate.
Figure 8:
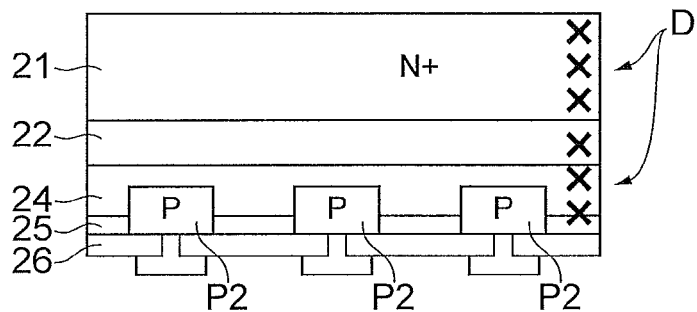
Figure 8:
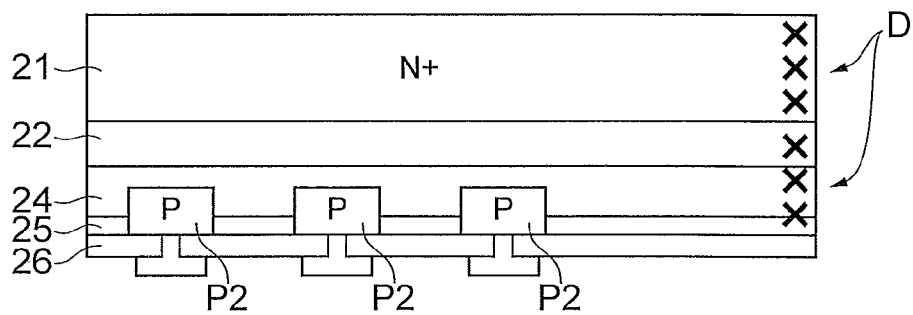

FIG. 8 includes views for explaining the effect of a stepped portion of the second semiconductor substrate 2.

Because approximating the second side surface S2 and a closest photodiode (pixel region P2) of the second photodiode array PDA2 to each other also suppresses degradation in output of this photodiode, it is not necessary to remove said photodiode. Accordingly, in such a structure, a reduction in the number of photodiodes per module can be suppressed.

That is, in the foregoing embodiment, as shown in FIG. 8(A), etching is performed up to a deep position, and then dicing is performed. In this case, a large quantity of crystal defects (shown by crosses) are introduced into the second side surface S2 as shown by an arrow D, but this position is outside a depletion layer, and the influence on the pixel regions P2 is slight. On the other hand, when etching is not performed, as shown in FIG. 8(B), a large quantity of crystal defects are introduced over the entire region of the side surface as shown by arrows D, and due to the crystal defects, noise is mixed in the pixel region P2 close to the side surface. As shown in FIG. 8(C), when the cut surface is remarkably isolated, a large quantity of crystal defects are introduced into the entire region of the side surface as shown by arrows D, but have small influence on the pixel regions P2. However, the first semiconductor substrate must be disposed isolated remarkably in such a case, which no longer allows performing spatially continuous imaging.

Next, the manufacturing method will be described.

In this method of manufacturing a photodiode array module, first, as shown in FIG. 1, a plurality of amplifiers AMP are formed, and a first semiconductor substrate 1 made of a first semiconductor material and a second semiconductor substrate 2 made of a second semiconductor material that needs to be adhered to the first semiconductor substrate 1 are prepared.

Next, a first photodiode array PDA1 is formed on the first semiconductor substrate 1. For the first photodiode array PDA1, an epitaxial layer 12 is grown on a semiconductor substrate 11, then by using a photolithography technique, a P-type impurity is diffused into such a well region thereof so as to contain a pixel forming region to form a well region P1 serving as anodes, and an N-type impurity is diffused into the pixel forming region to form pixel regions N1 serving as cathodes. Subsequently, an insulating layer 13 is formed on the epitaxial layer 12 by a thermal oxidation or CVD method, contact holes are opened therein, and contact electrodes E11, E12 are formed inside.

Subsequently, by connecting the contact electrodes E11, E12 with input terminals of the amplifiers AMP and the reference potential Vref or patterning wirings W1 to connect the amplifiers AMP with an external power supply Vext with aluminum or the like, a first semiconductor substrate 1 formed with a photodiode array is completed. Of course, the semiconductor substrate 1 is formed in plural numbers in a wafer, but by performing dicing after formation, the semiconductor substrate 1 shown in FIG. 1 is separated from the wafer.

The method of manufacturing the semiconductor substrate 2 is also the same as that of the first semiconductor substrate 1, and a buffer layer 22, a light absorbing layer 24, and a cap layer 25 are grown in sequence on a semiconductor layer 21. For the growth, a metalorganic chemical vapor deposition (MOCVD) method can be used. As source gases when growing InP or InGaAs, trimethylindium (TMI), trimethylgallium (TMGa), and trimethylarsine (TMAs) can be used.

Subsequently, pixel regions P2 of the second conductivity type (P type) located at a surface layer side of a surface of the second semiconductor substrate 2 opposed to the first semiconductor substrate 1 are formed to form a second photodiode array PDA2. That is, by using a photolithography technique, a P-type impurity is diffused into a pixel forming region thereof to form pixel regions P2 serving as anodes. Subsequently, an insulating layer 13 is formed on the cap layer 25 by a CVD method, contact holes are opened therein, and contact electrodes E21 and E22 are formed inside. Subsequently, by patterning wirings W2 to connect the contact electrodes E21 and E22 with the input terminals (−, +) of the amplifiers AMP with aluminum or the like, a second semiconductor substrate 2 formed with a photodiode array is completed. The respective electrodes on the cathode side are connected using common wirings.

Figure 13:
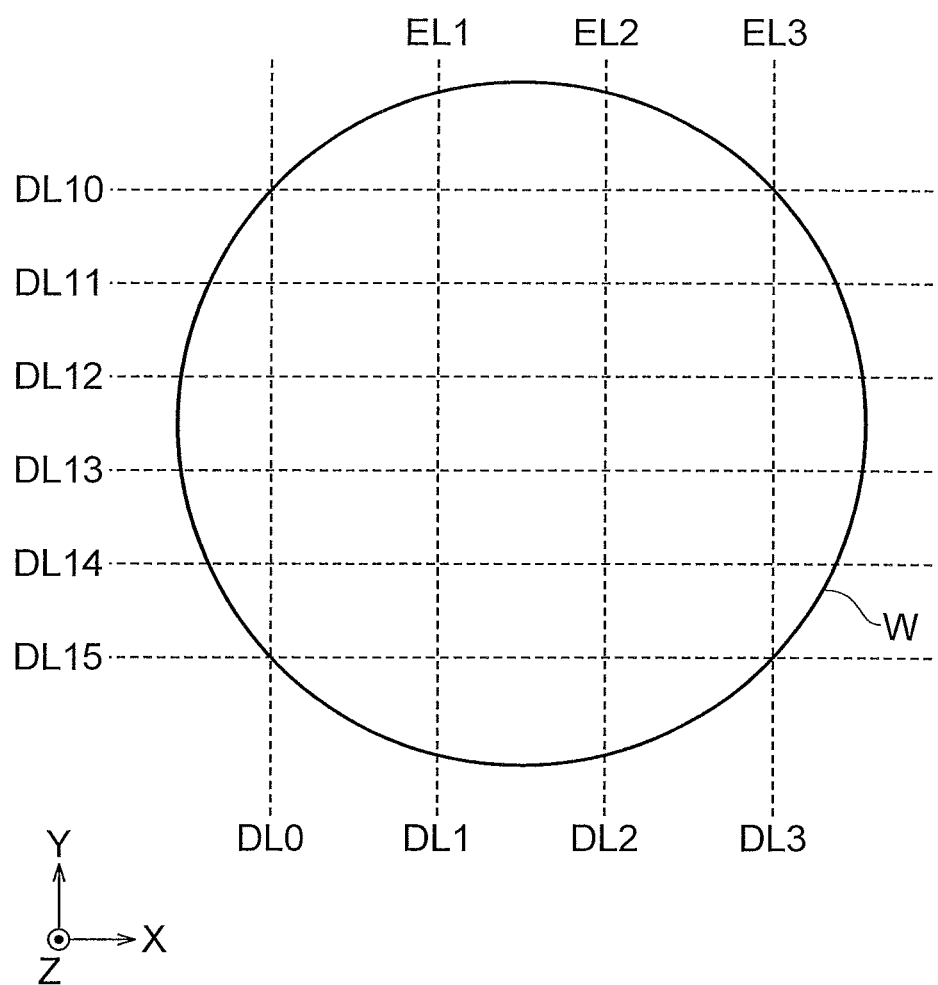
FIG. 13 is a plan view of a wafer for explaining wafer etching and dicing.

Of course, the second semiconductor substrate 2 is, as shown in FIG. 13, formed in plural numbers in a wafer W.

Also, as described above, by forming the first and second wiring groups W1, W2 via the insulating layer 13 on the first semiconductor substrate 1, the respective pixel regions of the first photodiode array PDA1 and the first group 1G of amplifiers AMP are electrically connected via the first wiring group W1, and the second wiring group W2 and the second group 2G of amplifiers AMP are electrically connected. That is, the first semiconductor substrate 1 and the second semiconductor substrate 2 are adhered to each other, the second photodiode array is disposed on the second wiring group W2 via the bumps B, and the second wiring group W2 and each of the pixel regions P2 of the second photodiode array are electrically connected.

For this wafer W, by performing etching and dicing after formation of respective elements, the second semiconductor substrate 2 shown in FIG. 1 is separated from the wafer. As this etching and dicing, as shown in FIG. 13, dicing is performed along dicing lines DL10 to DL15 in the longitudinal direction (X-axis) of the second semiconductor substrate 2, and in the lateral direction (Y-axis), etching lines EL1, EL2, EL3 are set only at spots to be adjacent to first semiconductor substrates, and dicing lines DL1 to DL3 are set so as to overlay the etching lines EL1, EL2, EL3. That is, after performing etching along the etching lines EL1, EL2, EL3, dicing is performed along these dicing lines DL1 to DL3 to form stepped portions. At a site not to be adjacent, a dicing line DL0 in the Y-axis direction can be separately set.

Figure 9:
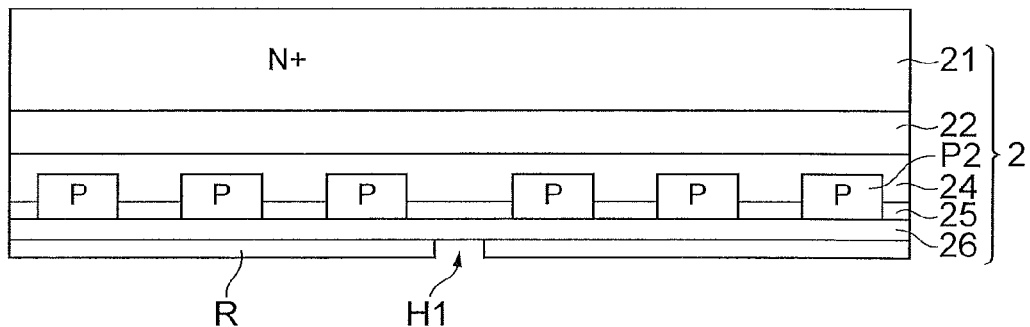
FIG. 9 includes views showing a formation process of a stepped portion of a second semiconductor substrate.
Figure 9:
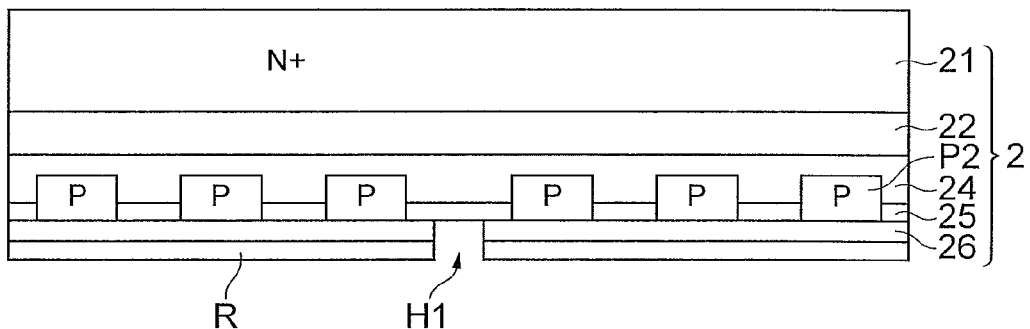
Figure 9:
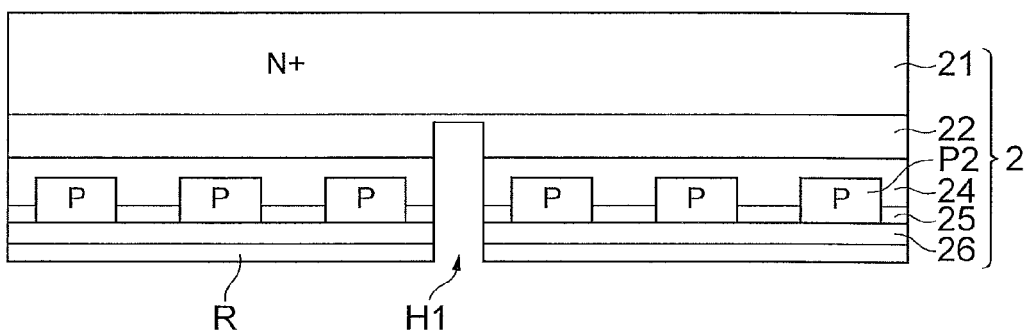
Figure 9:
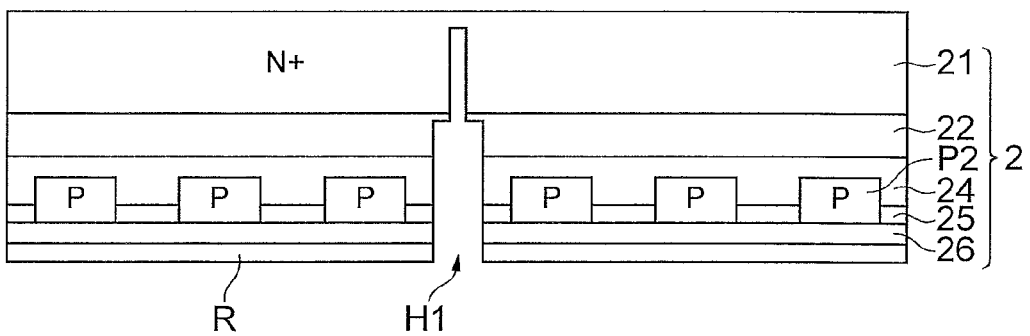

FIG. 9 includes views showing a formation process of a stepped portion of the second semiconductor substrate 2.

A resist R is coated on the front surface of a wafer including the second semiconductor substrate 2, and exposure and development is performed along an etching line so that the resist R has an opening (FIG. 9(A)). Thus, a line-shaped opening H1 is formed in the resist R. Next, an insulating film 26 of the front surface is etched using the resist R as a mask (FIG. 9(B)). This etching may be wet etching using a hydrofluoric acid aqueous solution, and may be dry etching using a chlorine-based etching gas. Here, wet etching is used for the etching.

Next, etching of the compound semiconductor is performed using the resist R and the insulating film 26 as a mask. In this etching, the wafer including the second semiconductor substrate 2 is etched up to a position deeper than the depth of the pixel regions P2 of the second photodiode array, in the present example, until reaching the buffer layer 22 (FIG. 9(C)). Here, wet etching is used for the etching. As an etchant for InP, a mixture of hydrochloric acid and phosphoric acid or an ordinarily used etchant such as a hydrochloric acid aqueous solution, a bromic acid-based etchant, or bromine-methanol can be used. As an etchant for InGaAs and InGaAsP, an ordinarily used etchant such as, for example, a citric acid-based etchant (a mixture of citric acid, hydrogen peroxide, and water) or a sulfuric acid-based etchant (a mixture of sulfuric acid, hydrogen peroxide, and water) can be used. Thus, an etched groove defined by the opening H1 is formed including one side surface (S1) of the second semiconductor substrate 2.

Further, by dicing a deepest portion of the etched groove along a dicing line, the second semiconductor substrate 2 is separated from the wafer (FIG. 9(D)). Also, the dicing is performed up to halfway through the semiconductor substrate 21, and in the case of separation, the semiconductor substrates are adhered to an expand tape, and separation is performed by expanding the expand tape, but of course, dicing may be performed until reaching the back surface of the substrate.

The first side surface S1 shown in FIG. 5 is a surface formed by etching the second semiconductor substrate 2 in its thickness direction, and the second side surface S2 is a surface formed by dicing the second semiconductor substrate 2 in its thickness direction. The density of crystal defects in a side surface produced by etching is smaller than the density of crystal defects in a side surface produced by dicing.

According to this method, the second semiconductor substrate 2 is separated from the wafer by etching the second semiconductor substrate 2 and then dicing a deepest portion of the etched groove. The density of crystal defects in the first side surface S1 (refer to FIG. 5) produced by etching is smaller than the density of crystal defects in the second side surface S2 (refer to FIG. 5) produced by dicing. Because the photodiode (pixel region P2) located in the end portion of the second semiconductor substrate 2 does not receive the influence of noise and therefore does not need to be removed, a reduction in the number of photodiodes can be suppressed.

Figure 10:
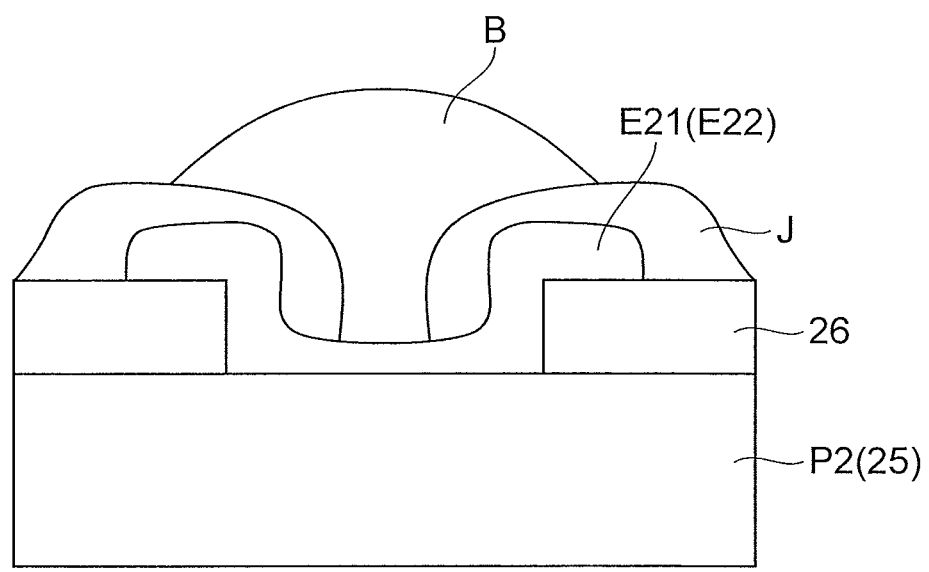
FIG. 10 is a view showing a structure near a bump.

FIG. 10 is a view showing a structure near a bump.

There is formed an insulating layer 26 on the semiconductor region P2 (or the cap layer 25), while there are formed contact holes in the insulating layer 26, and there are formed contact electrodes E21 (or E22) inside. Here, a resin layer J made of photosensitive polyimide or the like is interposed between the contact electrode (under bump metal) E21 (or E22) and the bump B. The resin layer J allows suppressing disconnection and electric field concentration near the bump B. Also, the bumps are made of a solder material, and the contact electrodes are made of a material such as Ti, Pt, and/or Au. Moreover, when the first semiconductor substrate and the second semiconductor substrate are bonded, the bumps B are provided not only on the second semiconductor substrate but also on wirings formed on the first semiconductor substrate 1, and melting and bonding of the bumps are performed with each pair of bumps opposed to each other.

Figure 11:
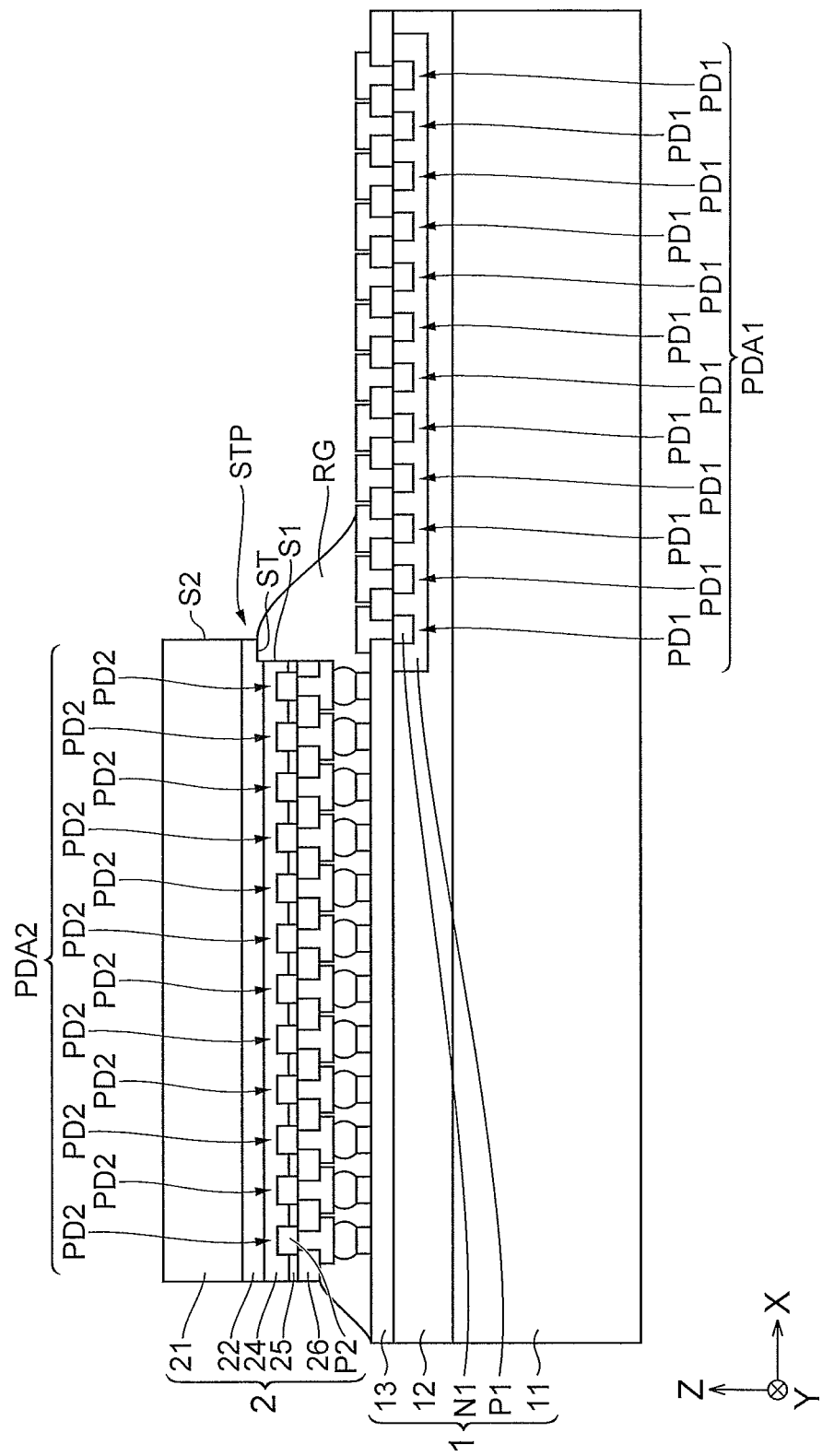
FIG. 11 is a sectional view of the photodiode array module including a resin layer.

FIG. 11 is a sectional view of the photodiode array module including a resin layer.

Moreover, this photodiode array module further includes a resin layer RG interposed between the first semiconductor substrate 1 and the second semiconductor substrate 2. In this case, the bonding strength between the first semiconductor substrate 1 and the second semiconductor substrate can be enhanced. The manufacturing method in this case further includes a step of interposing the resin layer RG between the first semiconductor substrate 1 and the second semiconductor substrate 2, so that the bonding strength between the first and second semiconductor substrates can be enhanced. The resin layer RG may be introduced between the substrates before adhesion of the substrates, but may be introduced after adhesion.

As the resin material, an epoxy-based resin can be used.

However, when the resin layer RG flows out toward the first semiconductor substrate 1, the accuracy of light detection in the first semiconductor substrate 1 degrades.

Figure 12:
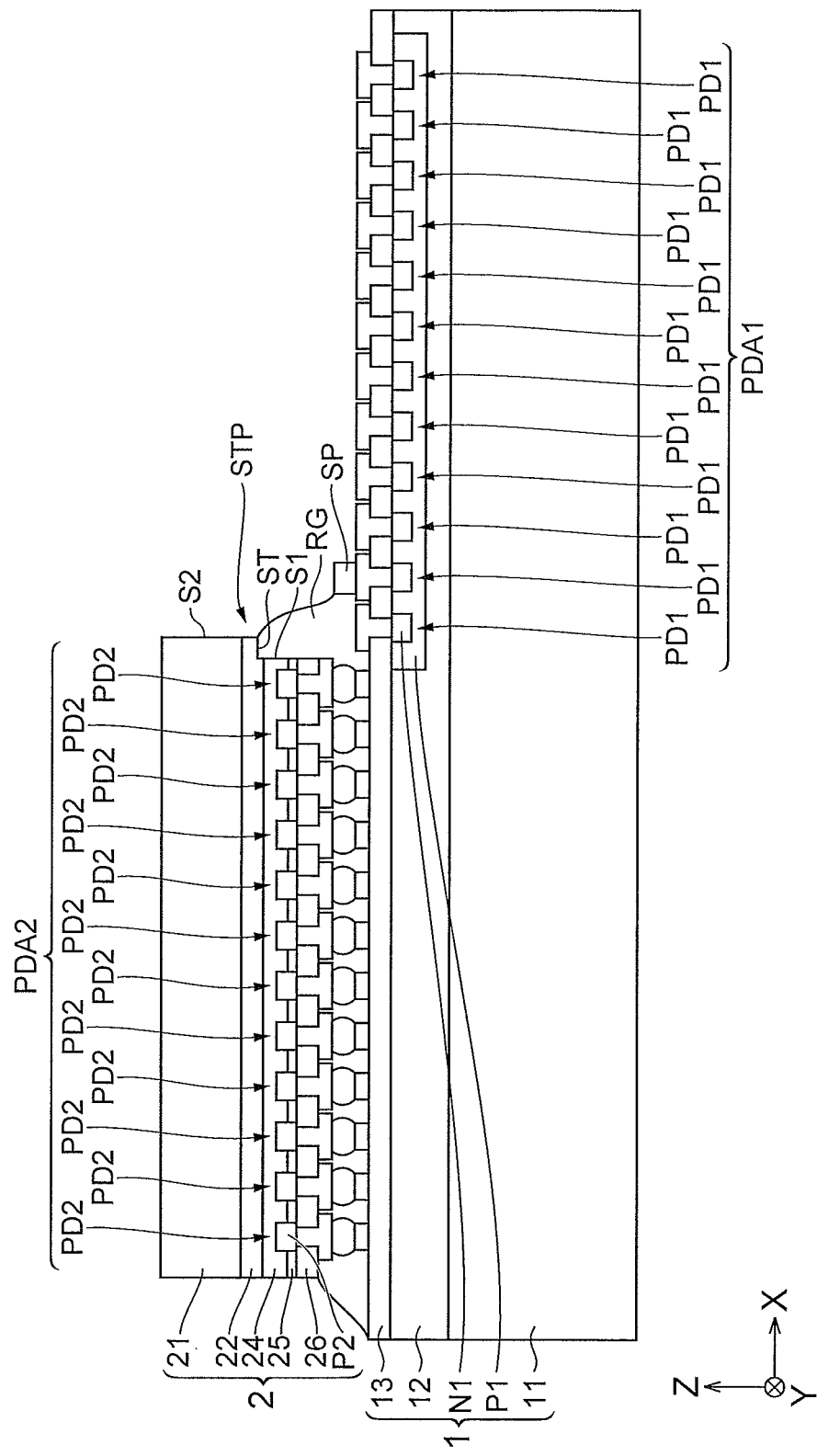
FIG. 12 is a sectional view of the photodiode array module including a damming member.

FIG. 12 is a sectional view of the photodiode array module including a damming member.

In this photodiode array module, when a resin layer RG is formed, a damming member SP that inhibits the material of the resin layer RG from flowing before curing is previously disposed on the first semiconductor substrate 1. The resin cures after formation of the resin layer RG. When there is a resin layer RG, there is a possibility of causing light attenuation, but when there is a linear damming member SP made of aluminum or the like, entry of the resin into the first photodiode array can be suppressed.

The manufacturing method in this case includes a step of forming a damming member SP on the first semiconductor substrate 1, a step of, when forming a resin layer RG, interposing the material of the resin layer RG between the first semiconductor substrate 1 and the second semiconductor substrate 2, and inhibiting the material of the resin layer from flowing by the damming member SP, and a step of curing the material of the resin layer RG. In this case, because the damming member SP inhibits the martial of the resin layer from flowing, entry of the resin into the first photodiode array PDA1 can be suppressed, and light attenuation in the first photodiode array PDA1 can be suppressed.

As above, the density of crystal defects in a side surface produced by etching is smaller than the density of crystal defects in a side surface produced by dicing. Because the photodiode located in the end portion of the second semiconductor substrate 2 does not need to be removed, a reduction in the number of photodiodes can be suppressed. Moreover, because the light receiving sections of the first semiconductor substrate 1 and the second semiconductor substrate 2 have a constant pitch and are successive, combining these with a spectroscope allows obtaining a continuous spectrum.

In the above, the photodiode array formed on the P-type first semiconductor substrate is composed of a P-type well region formed in the P-type epitaxial layer and photodiodes formed by the N-type diffusion layer formed in the well region, but the conductivity types may be reversed, and a diffusion layer of the opposite conductivity type may be directly formed in the epitaxial layer without forming a well region so as to be provided as photodiodes.

Also, in the second semiconductor substrate, for cathode extraction, contact holes are opened in the insulating layer formed on the cap layer, and contact electrodes are brought into direct contact with the cap layer, but in order to reduce contact resistance, a diffusion layer may be formed after opening contact holes, or the cap layer may be removed by etching to connect with the light absorbing layer by bumps. A diffusion layer may be formed to reduce contact resistance when connecting to the light absorbing layer, or etching may be performed up to the buffer layer or second semiconductor substrate to cause a direct connection.

Moreover, for a connection between the first photodiode array formed on the first semiconductor substrate and amplifiers, the cathodes of the photodiodes are connected to the inverting inputs (−) of the amplifiers, the anodes are connected to the reference potential Vref, and the non-inverting inputs (+) of the amplifiers are connected to the external power supply to take the form of a single amplifier, but this is a mere example. For a connection between the second photodiode array formed on the second semiconductor substrate and amplifiers, the anodes of the photodiodes are connected to the inverting inputs (−) of the amplifiers, the cathodes are connected to the non-inverting inputs (+) and common wirings CW2(1) and CW2(2) to take the form of a differential amplifier, but this is also a mere example. The common wirings CW2(1) and CW2(2) may be connected to the external power supply. The first photodiode array may take the form of a differential amplifier, or the second photodiode array may take the form of a single amplifier. There is an advantage that a bias voltage (a reverse bias voltage) can be applied to the photodiodes in the case of a single amplifier, and in the case of a differential amplifier, there is an advantage that the photodiodes can be with zero bias.

Moreover, the amplifiers serve as charge amplifiers each having a capacitance between the inverting input and output, but for resetting, a transistor is preferably provided as a reset switch in parallel with the capacitance. Moreover, outputs from the amplifiers are taken out from the terminals T, while a switch for determining whether or not to connect an output to the terminal T may be provided between the amplifier output and the terminal T.

REFERENCE SIGNS LIST

1 . . . first semiconductor substrate, 2 . . . second semiconductor substrate, PD1, PD2 . . . photodiode, P1, P2 . . . pixel region, STP . . . stepped portion, S1 . . . first side surface, S2 . . . second side surface.

The invention claimed is:

1. A photodiode array module comprising:
a first semiconductor substrate formed with a plurality of amplifiers, made of a first semiconductor material; and
a second semiconductor substrate adhered to the first semiconductor substrate, made of a second semiconductor material different from the first semiconductor material,
wherein
the first semiconductor substrate has a first photodiode array,
the second semiconductor substrate has a second photodiode array at a side of a surface opposed to the first semiconductor substrate,
a first group of a plurality of the amplifiers provided on the first semiconductor substrate via a first wiring group, each amplifier of the first group of plurality of amplifiers being individually electrically connected to a respective photodiode of the first photodiode array,
a second group of a plurality of the amplifiers provided on the first semiconductor substrate via a second wiring group and bumps respectively provided on the second wiring group, each amplifier of the second group of plurality of amplifiers being individually electrically connected to a respective photodiode of the second photodiode array,
in the second semiconductor substrate, an end portion close to the first photodiode array side has a stepped portion,
the stepped portion has:
a first side surface and a second side surface along a thickness direction of the second semiconductor substrate; and
a terrace surface located at a boundary between the first side surface and the second side surface and opposed to the first semiconductor substrate,
each of the photodiodes composing the second photodiode array includes:
a semiconductor region of a first conductivity type; and
a pixel region of a second conductivity type located at a surface layer side of a surface of the second semiconductor substrate opposed to the first semiconductor substrate,
a depth of the terrace surface from an opposing surface of the second semiconductor substrate to the first semiconductor substrate is deeper than a depth of the pixel region of the second photodiode array,
the first side surface is closer to the first semiconductor substrate than the second side surface, and
a crystal defect density in the first side surface is lower than a crystal defect density in the second side surface.

2. The photodiode array module according to claim 1, wherein
the first side surface is a surface formed by etching the second semiconductor substrate in its thickness direction, and
the second side surface is a surface formed by dicing the second semiconductor substrate in its thickness direction.

3. The photodiode array module according to claim 1, wherein
the second group of amplifiers m the first semiconductor substrate includes:
a first outer amplifier group; and
a second outer amplifier group, and the pixel regions are, along their array direction, electrically connected to one-side terminals of the first and the second outer amplifier groups alternately.

4. The photodiode array module according to claim 1, further comprising a resin layer interposed between the first semiconductor substrate and the second semiconductor substrate.

5. The photodiode array module according to claim 4, further comprising on the first semiconductor substrate a damming member which, when the resin layer is formed, inhibits a material of the resin layer from flowing before curing, wherein the resin cures after formation.

6. A method of manufacturing a photodiode array module comprising:
    a first semiconductor substrate formed with a plurality of amplifiers, made of a first semiconductor material; and
    a second semiconductor substrate adhered to the first semiconductor substrate, made of a second semiconductor material,
    said manufacturing method comprising:
    a step of forming a first photodiode array on the first semiconductor substrate;
    a step of forming a second photodiode array on the second semiconductor substrate;
    a step of, by forming first and second wiring groups via an insulating layer on the first semiconductor substrate, electrically connecting respective pixel regions of each photodiode of the first photodiode array with each individual amplifier of a first group of amplifiers via the first wiring group and electrically connecting via the second wiring group each photodiode of the second photodiode array with each individual amplifier of a second group of amplifiers;
    a step of etching a wafer including the second semiconductor substrate up to a position deeper than a pixel region of the second photodiode array to form an etched groove including a side surface of the second semiconductor substrate;
    a step of separating the second semiconductor substrate from the wafer by dicing a deepest portion of the etched groove; and
    a step of adhering the first semiconductor substrate and the second semiconductor substrate to each other, disposing the second photodiode array on the second wiring group via bumps, and electrically connecting the second wiring group and each of the pixel regions of the second photodiode array.

7. The method of manufacturing a photodiode array module according to claim 6, further comprising a step of interposing a resin layer between the first semiconductor substrate and the second semiconductor substrate.

8. The method of manufacturing a photodiode array module according to claim 7, comprising:
    a step of forming a damming member on the first semiconductor substrate;
    a step of when forming the resin layer, interposing a material of the resin layer between the first semiconductor substrate and the second semiconductor substrate, and inhibiting the material from flowing by the damming member; and
    a step of curing the resin layer material.

* * * * *